(12) United States Patent
Brown et al.

(10) Patent No.: US 7,123,665 B2
(45) Date of Patent: Oct. 17, 2006

(54) METHOD AND APPARATUS FOR MEASURING PHASE ERROR OF A MODULATED SIGNAL

(75) Inventors: James E. C. Brown, San Jose, CA (US); Bret Rothenberg, Los Altos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 748 days.

(21) Appl. No.: 10/435,272

(22) Filed: May 9, 2003

(65) Prior Publication Data

US 2004/0223572 A1   Nov. 11, 2004

(51) Int. Cl.
*H04L 27/12* (2006.01)
(52) U.S. Cl. ............... 375/303; 375/272; 375/274; 375/295; 375/296; 375/305; 455/43; 455/63; 455/67.1; 455/113; 455/115; 455/126; 332/126; 332/127; 332/162
(58) Field of Classification Search ............... 375/272, 375/274, 275, 295, 296, 303, 305, 371, 375; 455/42, 43, 50.1, 63, 67.1, 113, 115, 126; 332/100, 123, 124–128, 159–162
See application file for complete search history.

(56) References Cited

U.S. PATENT DOCUMENTS 6,008,703 A * 12/1999 Perrott et al. ............... 332/100

6,898,257 B1 * 5/2005 Fischer et al. ............... 375/376
2002/0071497 A1 * 6/2002 Bengtsson et al.

OTHER PUBLICATIONS

David Redmond, Morgan Fitzgibbon, Alan Bannon, Darren Hobbs, Chunhe Zhao, Kiyoshi Kase, Joseph Chan, Michael Priel, Kevin Traylor & keith Tilley, "A GSM/GPRS Mixed-Signal Baseband IC", IEEE International Solid-State Circuits Conference, vol. 45, Session 3, Paper 3.6, Feb. 4, 2002.
Daniel R. McMahill & Charles G. Sodini, "Automatic Calibration of Modulated Frequency Synthesizers", IEEE Transactions On Circuits and Systems—II: Analog and Digital Signal Processing, vol. 49, No. 5, pp. 301-311, May 2002.
Daniel R. McMahill & Charles G. Sodini, "A 2.5Mb/s GFSK 5.0-Mb/s 4-FSK Automatically Calibrated $\Sigma$-$\Delta$ Frequency Synthesizer", IEEE Journal of Solid-State Circuits, vol. 37 No. 1, pp. 18-26, Jan. 2002.

* cited by examiner

*Primary Examiner*—Dac V. Ha
(74) *Attorney, Agent, or Firm*—Steven A. Shaw; W. James Brady; Frederick J. Telecky, Jr.

(57) ABSTRACT

A method and apparatus for generating a burst FSK signal having precisely shaped transitions between modulation states. The apparatus uses feedforward compensation of phase gain and phase preemphasis coefficients for compensating the frequency conversion gain of the apparatus, and the phase gain coefficient is used for stabilizing a frequency synthesis loop. The phase gain and preemphasis coefficients are determined in a calibration within the time constraints of on-line signal bursts based upon measured phase errors and accelerated predicted phase gain and preemphasis phase errors.

22 Claims, 16 Drawing Sheets

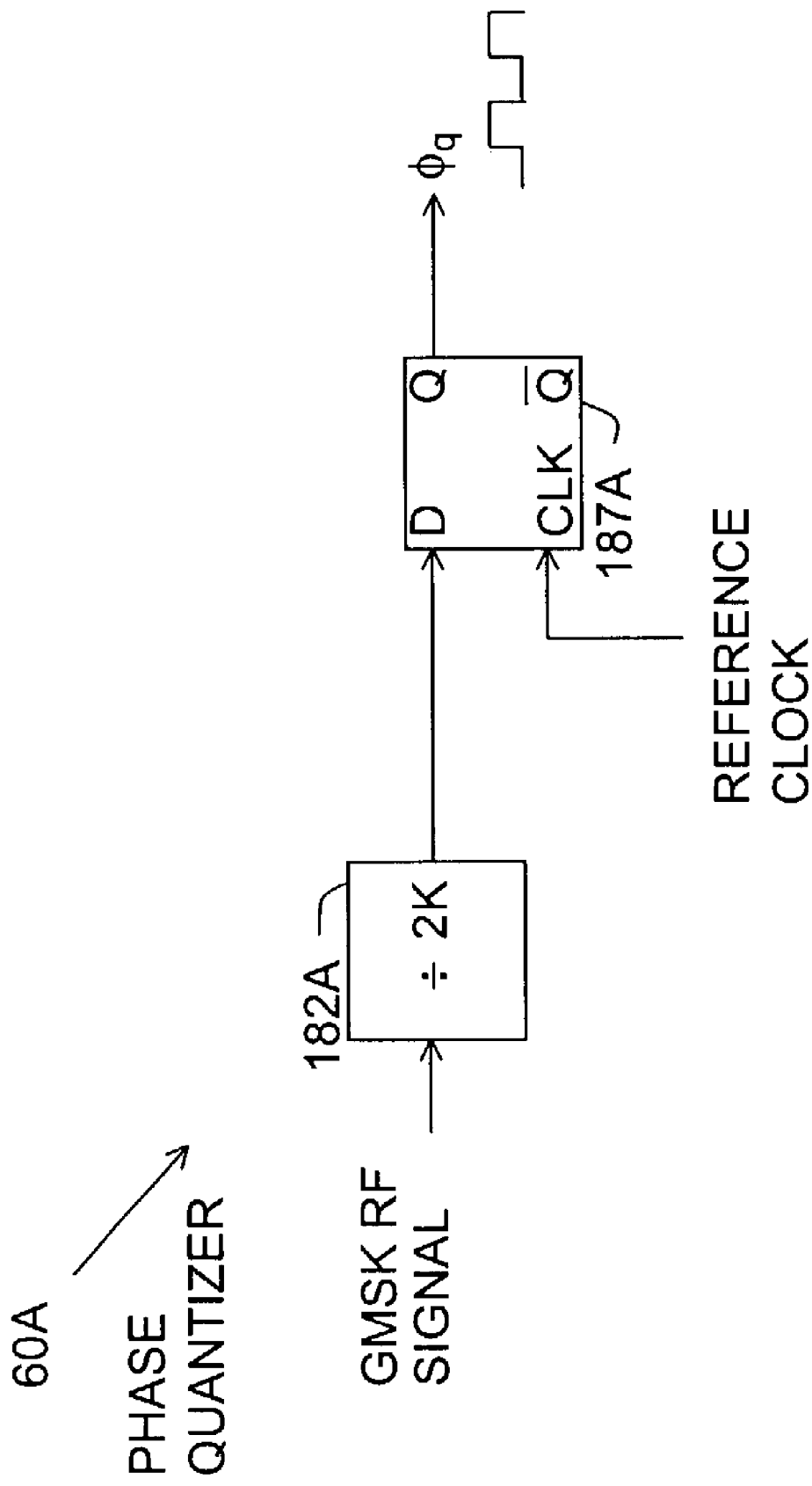

METHOD AND APPARATUS FOR MEASURING PHASE ERROR OF A MODULATED SIGNAL

BACKGROUND OF THE INVENTION

1. Fields of the Invention

The invention relates generally to frequency shift key (FSK) signal generators and more particularly to an FSK generator having high speed automatic calibration loops for determining phase gain and phase preemphasis correction coefficients and then using feedforward compensation for providing precisely shaped frequency transitions between modulation states in a burst mode modulated signal. The invention also relates particularly to a frequency hopping signal generator using phase gain coefficients for stabilizing loop gain of a frequency synthesis loop. The invention also relates particularly to an apparatus and a method for dynamic measurement of phase error of a modulated signal.

2. Description of the Prior Art

Minimum frequency shift key (MSK) modulation is commonly used in modern communication systems. In order to meet regulations for spectrum management, existing systems use filters for softening the transitions between FSK modulation states. However, recent regulations for FSK signal systems such as the Global System for Mobile Communications (GSM) system are so strict that the transitions between states are required to follow near Gaussian paths in order to meet spectrum requirements. Signals for such systems are sometimes known as Gaussian MSK (GMSK) signals.

Unfortunately, the filters for providing GMSK signals are difficult to produce and expensive. Workers in the art have proposed eliminating such filters by using correction circuitry for shaping the modulation frequency or phase during the transitions. Unfortunately, the methods developed heretofore are not suitable for practical application in a burst mode.

SUMMARY OF THE INVENTION

It is therefore an object of the present invention to provide methods and apparatus having high speed automatic calibration loops and feedforward compensation of phase gain and phase preemphasis coefficients for providing precisely shaped frequency transitions between modulation states in a burst mode modulated signal.

Briefly, in a preferred embodiment, a transmitter of the present invention includes a Gaussian shaper, a frequency synthesizer, a feedforward converter, a phase gain compensator, a phase preemphasis compensator, a phase quantizer, and a switched loop phase detector. The Gaussian shaper shapes binary input data for providing a digital Gaussian shaped input data signal. The frequency synthesizer uses the shaped input data signal and divide numbers in a frequency synthesis loop for generating a radio frequency (RF) modulated output signal at hopping carrier frequencies in bursts. The synthesis loop includes a voltage controlled oscillator (VCO). Inside the bandwidth of the synthesis loop, the modulation is controlled by the synthesis loop. Outside the bandwidth of the synthesis loop, the modulation is controlled by a feedforward signal that couples into the input of the VCO. The feedforward converter provides the feedforward signal by scaling the input data signal with phase gain coefficients corresponding to carrier frequencies and preemphasizing the input data signal with a phase preemphasis coefficient. The coefficients are determined in an initial calibration mode and then re-determined within calibration burst time slots between on-line signal bursts during high speed on-line burst signal communication. The phase gain coefficients are also used in a loop normalizer in the frequency synthesizer for stabilizing the loop gain of the frequency synthesis loop.

For calibration, the input data signal is a fixed input data signal and then a shaped sequential input data signal. The phase quantizer provides a quantized phase signal for the phase of the RF modulated signal. The switched loop phase detector includes a phase measurement loop for finding a phase calibration that minimizes a phase difference between the quantized phase signal and a fixed input phase signal that is determined from the fixed input data signal. This phase calibration eliminates an unknown erroneous phase offset. Then, the phase measurement loop is opened and the switched loop phase detector uses the phase calibration for calibrating phase of a sequential input phase signal for the sequential input data signal. The calibrated sequential input phase signal is compared to the quantized phase signal for determining measured phase errors.

The phase gain compensator includes a phase gain error predictor, a gain loop accelerator, a phase gain correlator and a gain accumulator. Predicted phase gain errors are determined from the sequential input data signal by the phase gain error predictor and the gain loop accelerator. With the phase measurement loop open, the phase gain correlator and the gain accumulator act within a gain calibration loop for correlating the predicted phase gain errors with the measured phase errors. The gain calibration loop uses feedback through the feedforward converter, the frequency synthesizer, the phase quantizer and the switched loop phase detector for determining the phase gain coefficients for carrier frequencies, respectively, that minimize the phase gain error correlations.

Similarly, the phase preemphasis compensator includes a phase preemphasis error predictor, a preemphasis loop accelerator, a phase preemphasis correlator and a preemphasis accumulator. Predicted phase preemphasis errors are determined from the sequential input data signal by the phase gain error predictor and the gain loop accelerator.

With the phase measurement loop open, the phase preemphasis correlator and the preemphasis accumulator act within a preemphasis calibration loop for correlating the predicted phase preemphasis errors with the measured phase errors. The preemphasis calibration loop uses feedback through the feedforward converter, the frequency synthesizer, the phase quantizer and the switched loop phase detector for determining the phase preemphasis coefficient that minimizes the phase preemphasis error correlations.

For operation, the input data signal is a shaped burst on-line input data signal. The feedforward converter and the frequency synthesizer use the on-line input data signal, the phase gain coefficients and the phase preemphasis coefficients for providing the burst modulated output signal.

In order to reduce (improve) the time for burst calibration, the switched loop phase detector uses a closed phase measurement loop for eliminating an arbitrary phase offset, then opens the phase measurement loop for providing dynamic phase measurement errors. The phase measurement errors are compared to predicted phase gain and preemphasis errors in fast response gain calibration and preemphasis calibration loops, respectively, using feedforward compensation for determining the phase gain and phase preemphasis coefficients. For operation, the phase measurement, and gain and preemphasis calibration loops open.

In order to further reduce time for burst calibration, the gain and preemphasis loop accelerators use predetermined acceleration coefficients based upon the known characteristics of a pseudorandom binary sequence (PRBS) input data signal for weighting predicted estimates of phase gain and phase preemphasis errors in order to provide the predicted phase gain and preemphasis errors.

In order to reduce time for hopping between carrier frequencies, the loop normalizer uses the phase gain coefficients to normalize a frequency dependent loop gain of the frequency synthesis loop.

An advantage of the present invention is that modulation in an output signal is precisely calibrated within the time constraints of the burst time slots of a burst mode signal system.

These and other objects and advantages of the present invention will no doubt become obvious to those of ordinary skill in the art after having read the following detailed description of the preferred embodiments which are illustrated in the various figures.

IN THE DRAWINGS

FIG. 6A is an alternative embodiment phase quantizer of the transmitter of FIG. 1;

Figure 1:
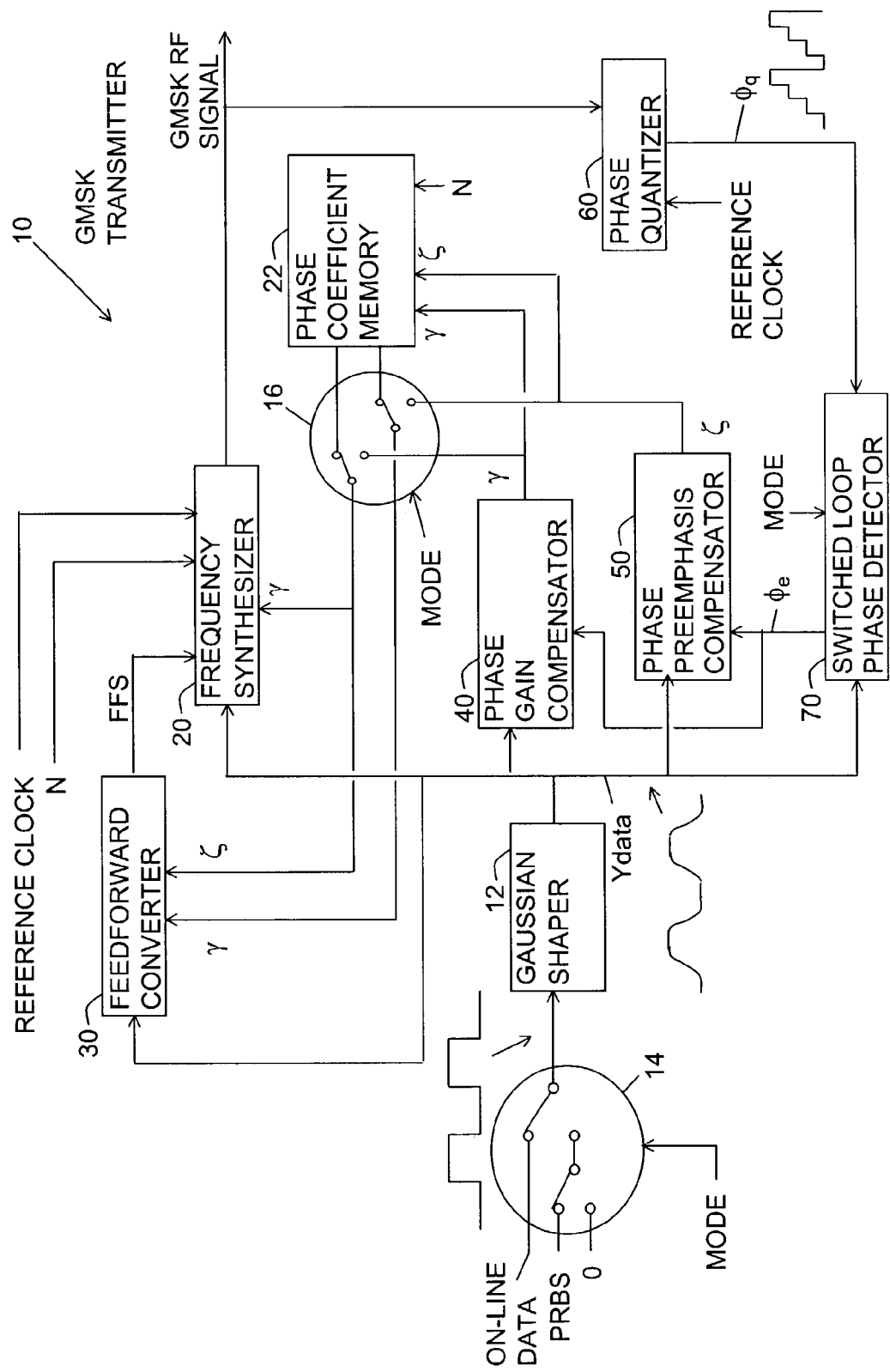
FIG. 1 is a block diagram of a Gaussian minimum frequency shift key (GMSK) transmitter of the present invention.
Figure 9:
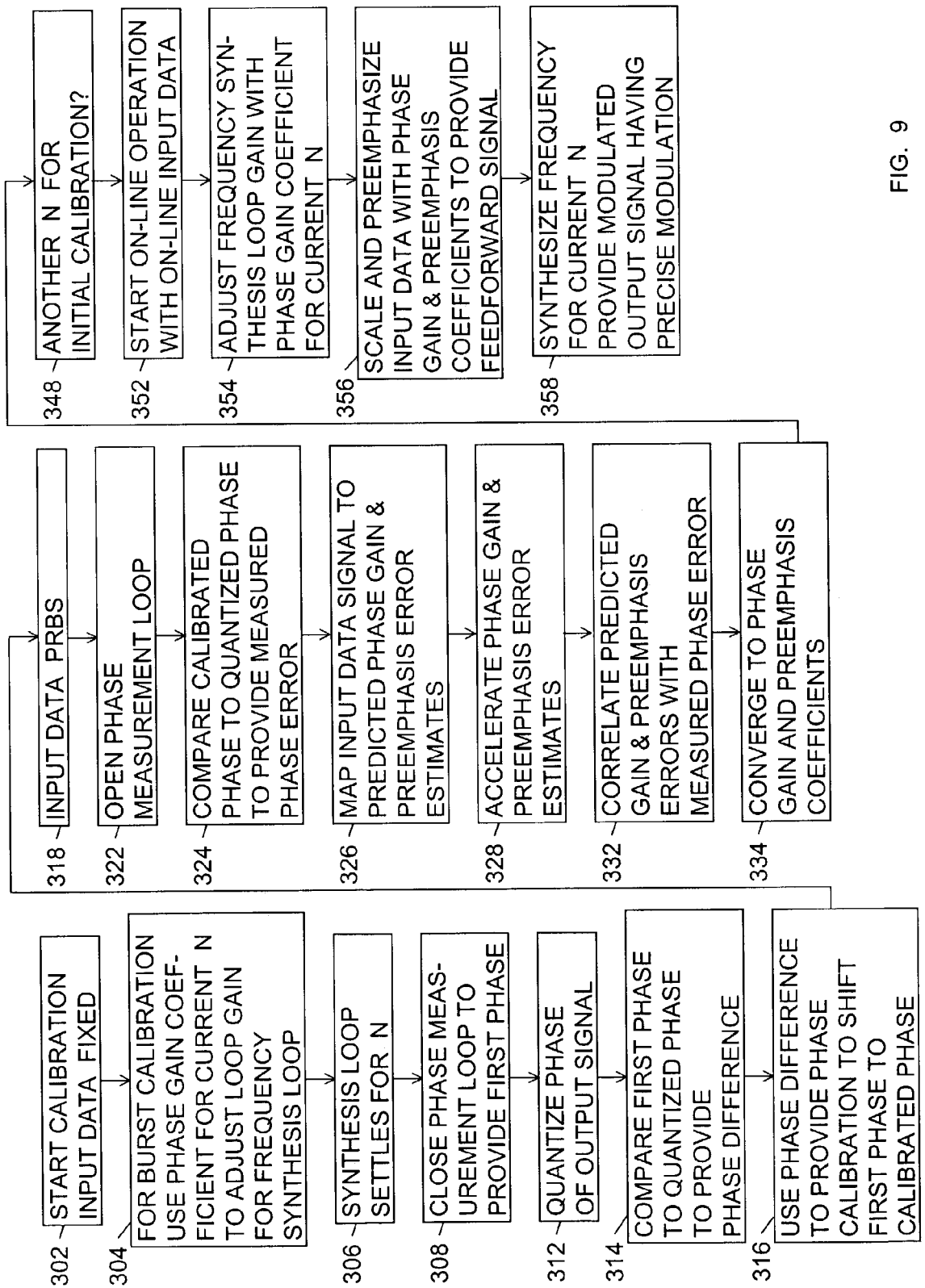
Figure 10A:
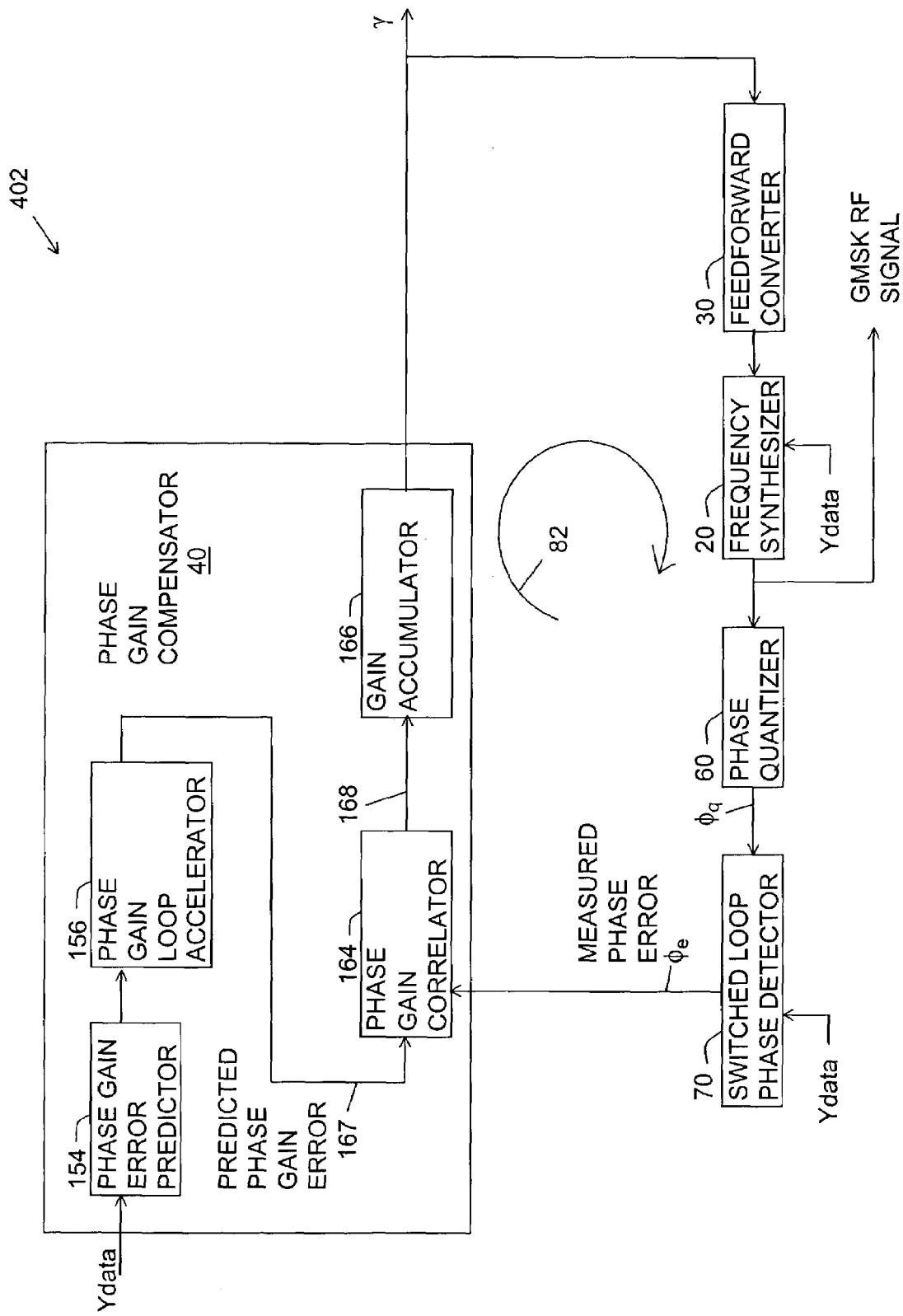
Figure 10B:
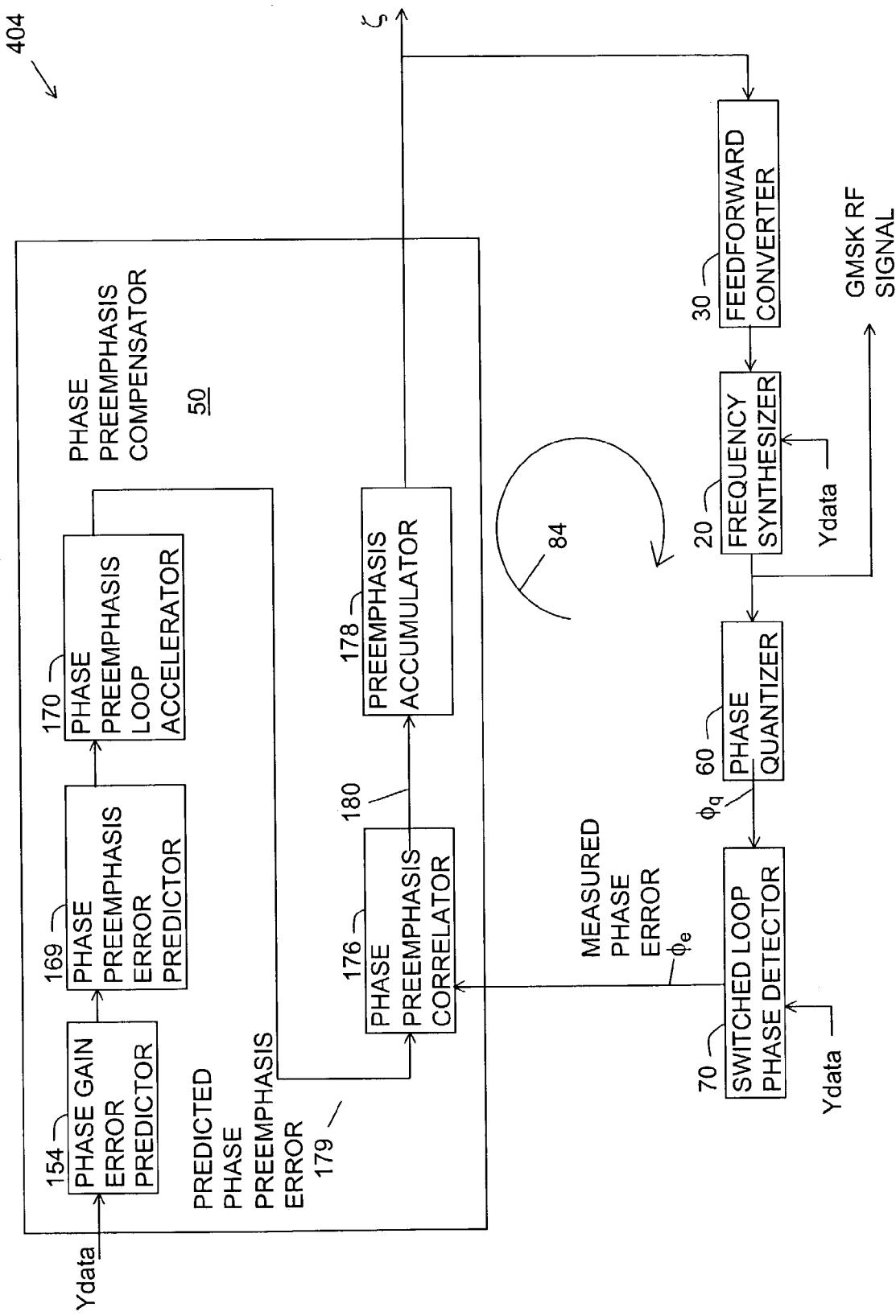
Figure 11A:
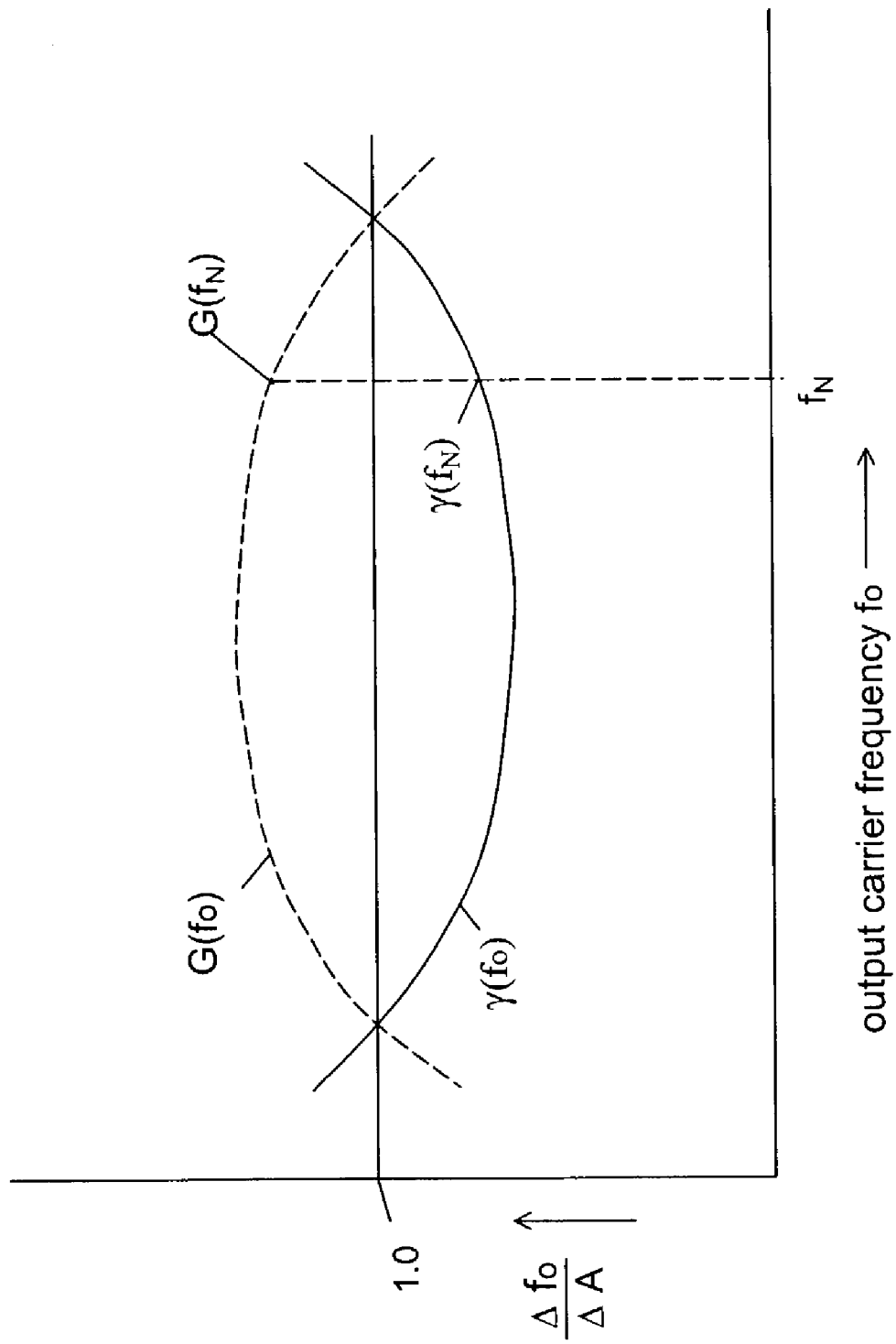
Figure 11B:
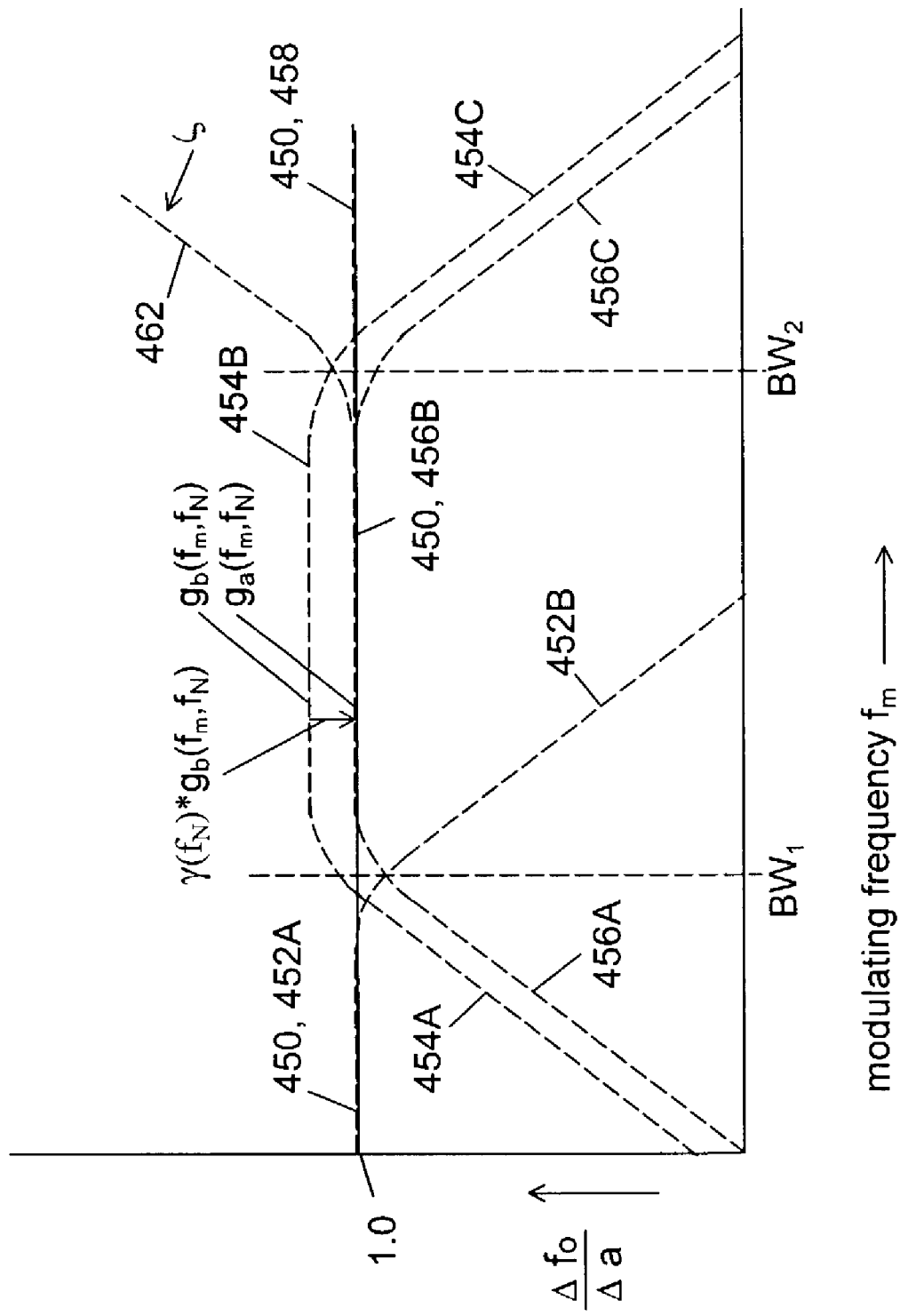

FIG. 9 a flow chart of a calibration method for the transmitter of FIG. 1;

FIGS. 10A and 10B are block diagrams showing gain and preemphasis calibration loops for determining phase gain and preemphasis coefficients, respectively, for the transmitter of FIG. 1;

FIG. 11A is a chart of the phase gain coefficients of FIG. 10A versus carrier frequency for the transmitter of FIG. 1; and FIG. 11B is a chart showing phase gain and preemphasis coefficients of FIGS. 10A and 10B versus modulating frequency for the transmitter of FIG. 1.

DETAILED DESCRIPTION OF THE PREFERRED EMBODIMENTS

FIG. 1 is a block diagram of a Gaussian minimum shift key (GMSK) signal generator or transmitter referred to by the general reference number 10 for providing a radio frequency (RF) GMSK frequency modulated output signal. The GMSK transmitter is described herein as adapted for the Global System for Mobile Communications (GSM). However, the idea of the GMSK transmitter 10 of the present invention can be applied to other systems where the accuracies of the modulation states and the paths of the transitions between the modulation states is important. GSM is also known as Groupe Speciale Mobile.

The GMSK transmitter 10 includes a Gaussian input data shaper 12, an input mode switch 14, an output mode switch 16, a frequency synthesizer 20, a phase coefficient memory 22, a feedforward converter 30, a phase gain compensator 40, a phase preemphasis compensator 50, a phase quantizer 60, and a switched loop phase detector 70.

The GMSK transmitter 10 has two modes: a calibration mode where compensation coefficients are determined and an on-line operation mode where the compensation coefficients are used to improve the precision of the modulation for transmitting communication data. An initial or full calibration is used when the GMSK transmitter 10 is turned on or by request from system software, and a burst calibration is used during designated burst time slots interspersed with the burst time slots of on-line operation. For a calibration (initial or burst) the mode switch 14 first selects a fixed level, preferably 0, and then a pseudorandom binary sequence (PRBS). For on-line operation, the mode switch 14 selects on-line binary data to be transmitted. The mode switch 14 passes the selection to the Gaussian shaper 12.

The Gaussian shaper 12 uses a finite impulse response (FIR) filter for shaping the binary data from the mode switch 14 into a multilevel digital input data signal, denoted as Ydata, having Gaussian shaped transitions between binary data states. In the calibration mode the Ydata input data signal is a calibration input data signal having fixed and then shaped sequential values for providing a calibration modulated output signal having fixed and then sequential frequency modulation. In the operation mode the Ydata input data signal is shaped on-data for providing an on-line modulated output signal having on-line frequency modulation. In a preferred embodiment the Ydata input data signal has nineteen bits. Digital data and calibration signals in the present invention have a sufficient number of bits to enable the RF modulated output signal to have a fractional spacing of less than one Hertz and a root mean square (RMS) phase error of less than about one degree.

The Gaussian shaped Ydata drives the frequency synthesizer 20, the feedforward converter 30, the phase gain compensator 40, the preemphasis gain compensator 50, and the switched loop phase detector 70. The frequency synthesizer 20 uses a reference clock signal, the Ydata, a feedforward signal FFS, and a divide number N comprised of an integer number and a fraction for providing the GMSK RF output signal. The fraction of the divide number N is an irrational number.

The phase coefficient memory 22 stores phase gain coefficients, denoted by γ, for a calibration list of divide numbers N, respectively, and stores a phase preemphasis coefficient, denoted by ζ, that are determined in the calibration mode. During on-line operation, the output mode switch 16 passes the stored phase gain coefficient γ for the divide number N currently in use, to the frequency synthesizer 20 and the feedforward converter 30, and passed the stored phase preemphasis coefficient ζ to the feedforward converter 30. Interpolation between values of the divide number N may be used for providing the phase gain coefficient γ when the divide number N currently in use is between two divide numbers N in the calibration list of the divide numbers N. The feedforward converter 30 scales the Ydata according to the stored phase gain coefficient γ and preemphasizes the Ydata according to the stored phase preemphasis coefficient ζ and then provides the scaled and preemphasized Ydata as the feedforward signal FFS.

For calibration, the output mode switch 16 passes an output from the phase gain compensator 40 to the feedforward converter 30 until a phase gain calibration loop 82 (FIG. 10A) drives the output to converge to the correct phase gain coefficient γ for the divide number N currently in use. The output mode switch 16 also passes an output from the phase preemphasis compensator 50 to the feedforward converter 30 until a phase preemphasis calibration loop 84 (FIG. 10B) drives the output to converge to the correct phase preemphasis coefficient ζ.

The phase gain compensator 40 generates the phase gain coefficients γ from the Ydata and measured phase errors $\phi_e$ and the phase preemphasis compensator 50 generates the phase preemphasis coefficient ζ from the Ydata and the measured phase errors $\phi_e$. The phase gain coefficients γ are also used for stabilizing (normalizing) the loop gain of a frequency synthesis phase lock loop 86 (FIG. 2) in the frequency synthesizer 20 for on-line operation and burst calibration modes.

The phase quantizer 60 quantizes the phase of the GMSK RF signal for providing quantized phases $\phi_q$ in a quantized phase signal. The switched loop phase detector 70 integrates the Ydata for providing a calibrated input phase signal and then compares the phases in the calibrated input phase signal to the quantized phases $\phi_q$ for providing the measured phase errors $\phi_e$ used by the phase gain compensator 40 and the phase preemphasis compensator 50.

The term "frequency conversion gain" refers to a ratio of the frequency modulation deviation Δfo of the modulated output signal to the desired frequency deviation $\Delta f_{in}$ represented by the value of the Ydata input data signal. The term "phase gain" refers to a ratio of the phase deviation of the modulated output signal to the desired input phase deviation derived by integrating the value of the Ydata input data signal. The term "phase preemphasis" refers to an increase in phase gain in response to an increase in modulating frequency $f_m$. The phase gain error and the phase preemphasis error refer to the difference between the actual and the desired phase gain and phase preemphasis, respectively. It should be noted that a voltage controlled oscillator (VCO) 104 in the frequency synthesizer 20 also has a frequency dependent frequency conversion gain for the ratio the frequency modulation deviation Δfo to a change in level of the input drive signal to the VCO 104.

Figure 2:
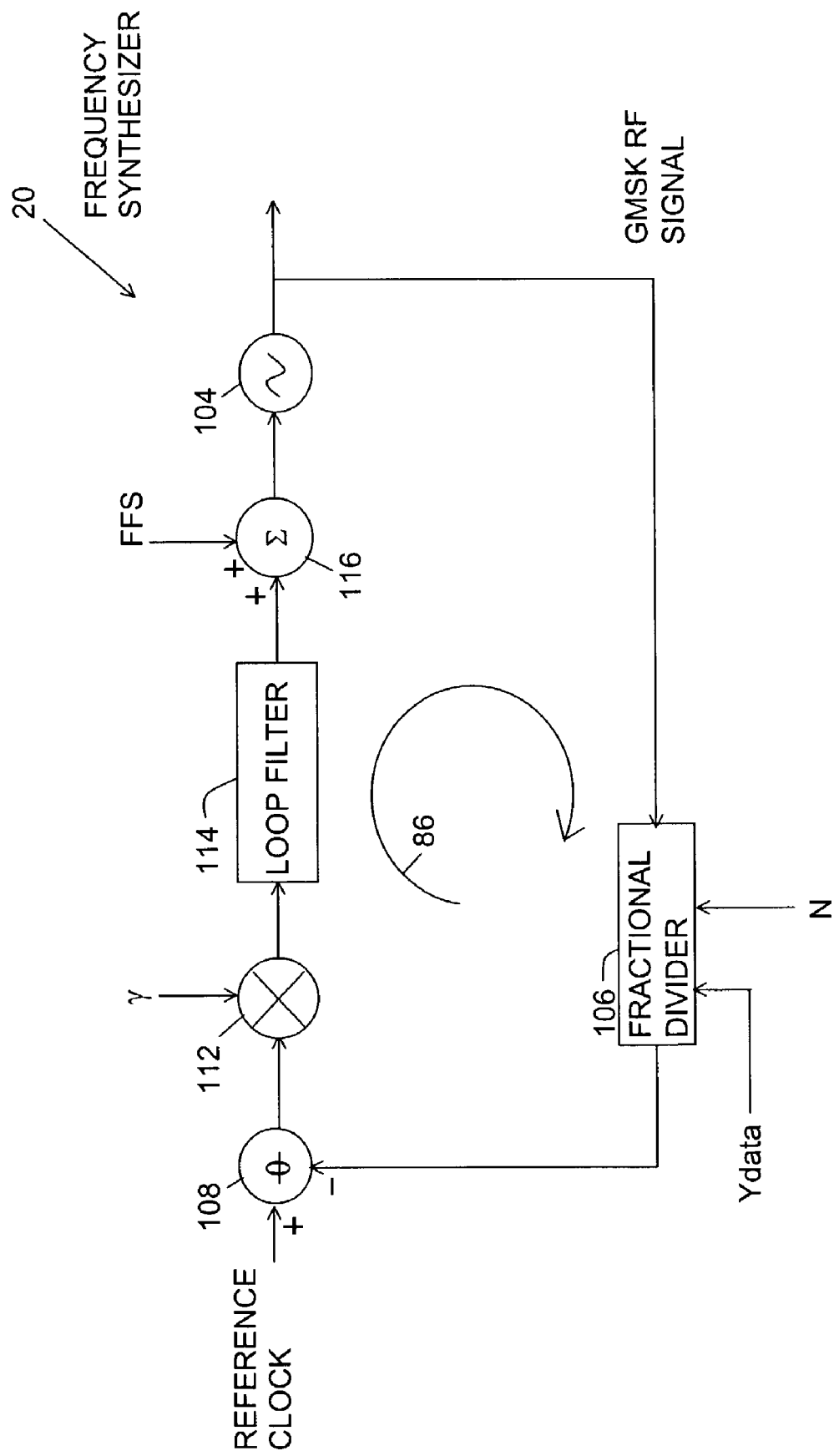
FIG. 2 is a block diagram of a frequency synthesizer of the transmitter of FIG. 1.

FIG. 2 is a block diagram of the frequency synthesizer 20. The frequency synthesizer 20 uses the frequency synthesis loop 86 for providing the RF GMSK modulated output signal. The loop 86 includes the VCO 104, a fractional divider 106, a phase comparator 108, a loop normalizer 112, a loop filter 114, and a feedforward summer 116. The VCO 104 issues the GMSK RF signal. In a preferred embodiment the RF output frequency hops in steps of about 13 megahertz within ranges from about 3296 megahertz to about 3396 megahertz, about 3420 megahertz to about 3570 megahertz, about 3504 megahertz to about 3660 megahertz, and about 3700 megahertz to about 3820 megahertz. More than one physical VCO may be switched in and out of the frequency synthesizer 20 in order to cover the ranges. In addition, the RF output signal is burst on and off in time slots of about five hundred seventy microseconds.

The fractional divider 106 frequency divides the GMSK RF signal by a divide number derived from the Ydata and the divide number N for providing a frequency divided signal. In conceptual terms the sum of the divide number N sets the carrier frequency of the GMSK RF signal, and the Ydata modulates the frequency of the GMSK RF signal for modulating frequencies $f_m$ that are inside a synthesis bandwidth $BW_1$ (FIG. 11B) of the loop 86. The frequency divided signal from the fractional divider 106 is issued to the phase comparator 108. The phase comparator 108 provides a loop error signal by comparing the phase of the frequency divided signal to the phase of the reference clock signal. Preferably, the reference clock signal has a frequency of about twenty-six megahertz.

The loop normalizer 112 amplifies the loop error signal by the phase gain coefficient γ for the current divide number N either before or after the loop filter 114 in order to adjust the gain of the synthesis loop 86 to compensate for variations in voltage to frequency conversion gain of the VCO 104 at different output frequencies. The effect of the adjustment is to normalize the loop gain of the synthesis loop 86 to the same preselected gain across the range of VCO output frequencies. After adjustment, the product of the gain of the loop normalizer 112 and the frequency conversion gain of the VCO 104 is held constant for all output frequencies. For the burst calibration and operation of the preferred embodiment, the phase lock loop 86 must settle in less than about one-hundred seventy microseconds. Because the compensation adjustment holds the loop gain constant, the frequency response of the loop 86 can be designed for a fast settling time without being unstable at some output frequency.

The γ multiplied signal is received by the loop filter 114. The loop filter 114 applies frequency domain poles and/or zeroes to provide the desired settling time, and a frequency response for stabilizing the frequency synthesis loop 86. The loop filter 114 then passes the filtered signal to the feedforward summer 116. The feedforward summer 116 adds the filtered signal with the feedforward signal FFS and provides the sum to the VCO 104 to control the frequency of the VCO 104 for the GMSK RF signal. The feedforward signal FFS controls the frequency of the VCO 104 for modulating frequencies outside the bandwidth $BW_1$ (FIG. 11B) of the synthesis loop 86.

Figure 3:
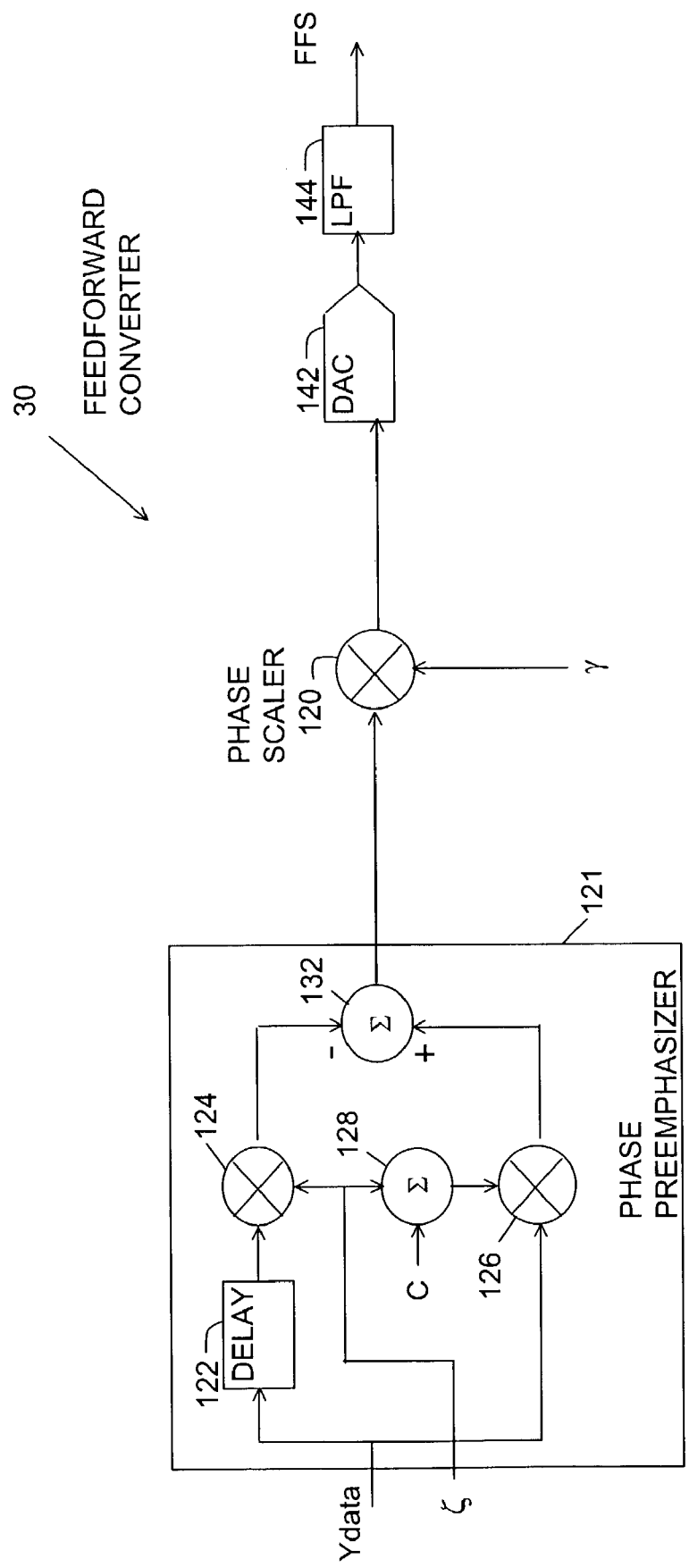
FIG. 3 is a block diagram of a feedforward converter of the transmitter of FIG. 1.

FIG. 3 is a block diagram of the feedforward converter 30 for feedforward scaling the Ydata input data signal. The feedforward converter 30 can be constructed as a two tap finite impulse response (FIR) filter where the phase gain coefficient γ and the phase preemphasis coefficient ζ are fed to the two taps. In a preferred embodiment, the feedforward converter 30 includes a phase scaler 120 for gain scaling the Ydata input data signal and a phase preemphasizer 121 for accentuating the higher frequencies of the Ydata input data signal. The phase preemphasizer 121 includes a delay 122, first and second preemphasis multipliers 124 and 126, respectively, a first summer 128, and a second summer 132.

The delay 122 delays the Ydata. The first multiplier 124 multiplies delayed Ydata by the phase preemphasis coefficient ζ for providing a first product. The summer 128 adds a scaling constant C, preferably providing one sixteenth of full scale of the Ydata referred to the output of the second multiplier 126, to the phase preemphasis coefficient ζ for providing an offset preemphasis coefficient. The second multiplier 126 multiplies the Ydata by the offset preemphasis coefficient for providing a second product. The second summer 132 takes a difference between the first and second products for providing a preemphasized signal. The combination of the multipliers 124 and 126 and the summers 128 and 132 accentuates the Ydata at higher modulating frequencies $f_m$ without effecting the lower modulating frequencies $f_m$. The phase scaling and the phase preemphasis scaling are independent of each other and the phase scaler 120 and the phase preemphasizer 121 may be disposed before or after the other. The phase scaler 120 receives the preemphasized signal through a delay, multiplies the delayed preemphasized signal by the phase gain coefficient $\gamma$, and issues a digital feedforward signal.

The feedforward converter 30 also includes a digital-to-analog converter (DAC) 142, and a low pass filter (LPF) 144. The DAC 142 receives the digital feedforward signal through a delay and converts the delayed digital feedforward signal to an analog DAC output signal. The LPF 144 has a filter bandwidth $BW_2$ (FIG. 11B) for low pass filtering the DAC output signal to remove noise that was generated by the DAC 142 and provides the filtered signal as the feedforward signal FFS to the frequency synthesizer 20.

Figure 4:
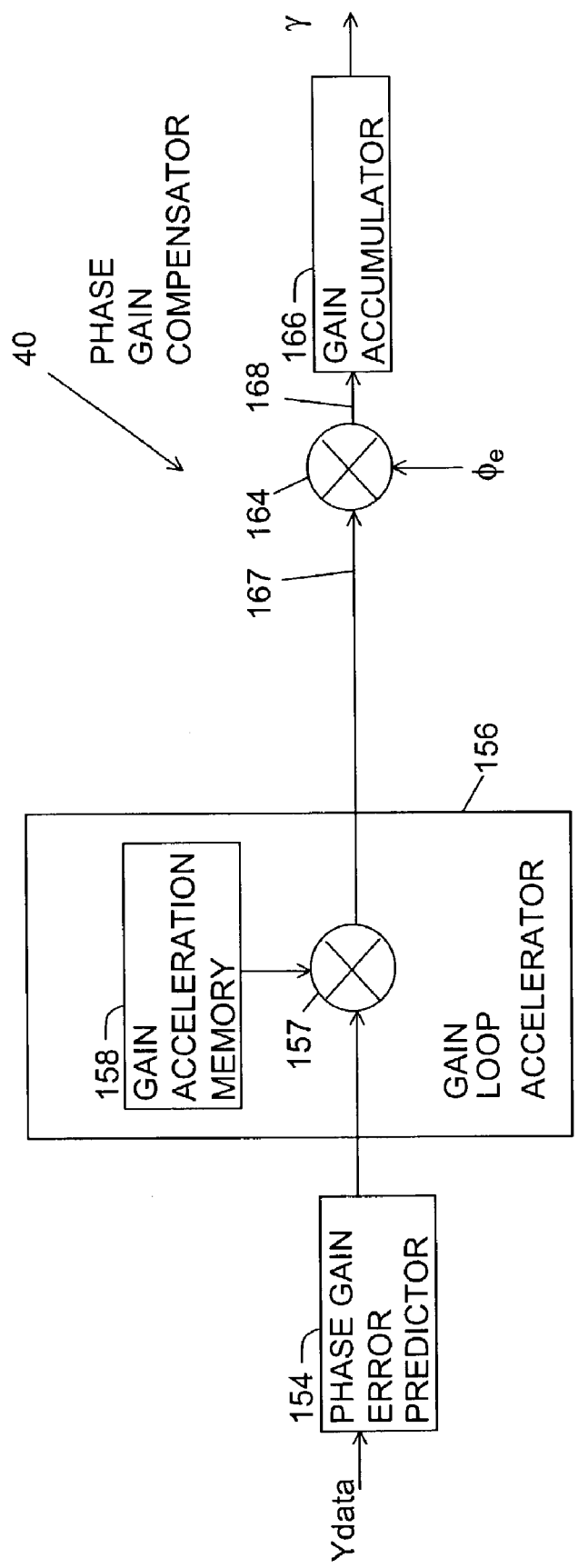
FIG. 4 is a block diagram of a phase gain compensator of the transmitter of FIG. 1.

FIG. 4 is a block diagram of the phase gain compensator 40 for determining phase gain coefficients $\gamma$ during calibration of the GMSK transmitter 10. The phase gain coefficients $\gamma$ that are determined during calibration are stored in the phase coefficient memory 22. The phase gain compensator 40 includes a phase gain error predictor 154, a gain loop accelerator 156 including a gain acceleration multiplier 157 and a gain acceleration memory 158, a phase gain correlator 164, and a gain accumulator 166. The phase gain error predictor 154 maps the Ydata according to a precalculated prediction of phase conversion gain error (an integral of frequency conversion gain error) transfer function to a predicted phase gain error estimate for the GMSK RF signal. The precalculated prediction of the phase conversion gain error is based upon models and known average characteristics of the elements of the GMSK transmitter 10 and especially the VCO 104, or else measured during the design of the GMSK transmitter 10.

The phase gain error predictor 154 passes the predicted phase gain error estimate to the gain acceleration multiplier 157. The gain acceleration multiplier 157 weights the digital information in the predicted phase gain error estimate according to precomputed gain loop acceleration coefficients stored in the gain acceleration memory 158 to provide an accelerated predicted phase gain error estimate. The accelerated predicted phase gain error estimate is used for a predicted phase gain error, denoted as 167. The predicted phase gain error 167 is passed through a delay to the phase gain correlator 164. The correlator 164 correlates the predicted phase gain error 167 with the measured phase error $\phi_e$ from the switched loop phase detector 70 for providing a phase gain error correlation, denoted as 168, sometimes known as a gradient. During the calibration, the gain calibration loop 82 (FIG. 10A) acts to find the phase gain coefficient $\gamma$ to minimize this correlation 168, thereby determining the phase gain coefficient $\gamma$ that correctly compensates the modulated GMSK signal for providing precise modulation.

The phase gain error correlation 168 is integrated by the accumulator 166 and the integrated phase gain error correlation is issued as the phase gain coefficient $\gamma$ to the phase coefficient memory 22 for each of a calibration list of the divide numbers N. The phase gain coefficients $\gamma$ are used to improve the accuracy of the frequency modulation $\Delta fo$. The phase gain coefficients $\gamma$ are also used to stabilize the gain of the frequency synthesis loop 86 in the frequency synthesizer 20 to compensate for the variation in voltage to frequency conversion gain of the VCO 104 for different output frequencies.

Figure 5:
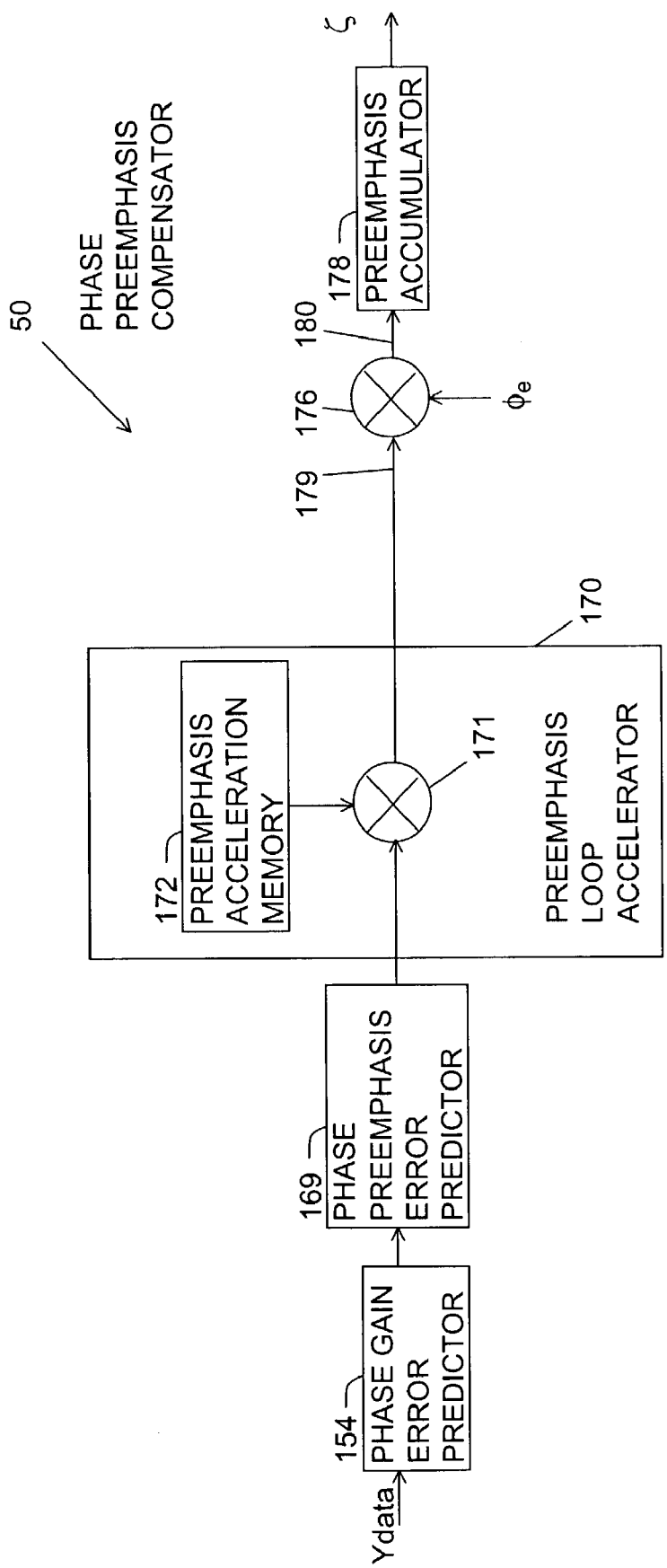
FIG. 5 is block diagram of a phase preemphasis compensator of the transmitter of FIG. 1.

FIG. 5 is a block diagram of the phase preemphasis compensator 50 for determining a phase preemphasis coefficient $\zeta$ during calibration of the GMSK transmitter 10. The phase preemphasis coefficient $\zeta$ that is determined during calibration is stored in the phase coefficient memory 22. The phase preemphasis compensator 50 includes the phase gain error predictor 154 (preferably shared with the phase gain compensator 40), a phase preemphasis error predictor 169, a preemphasis loop accelerator 170 including a preemphasis acceleration multiplier 171 and a preemphasis acceleration memory 172, a phase preemphasis correlator 176, and a preemphasis accumulator 178. The phase gain error predictor 154 maps the Ydata according to the predetermined phase gain error transfer function to a predicted phase gain error estimate for the GMSK RF signal as described above. The phase preemphasis error predictor 169 maps the predicted phase gain error estimate according to a precalculated prediction of the frequency response transfer function to a predicted phase preemphasis error estimate for the GMSK RF signal.

The precalculated prediction of the phase preemphasis error estimate is based upon models and known average characteristics of the elements of the GMSK transmitter 10 and especially the filter 144, or else measured during the design of the GMSK transmitter 10.

The phase preemphasis error predictor 169 passes the predicted phase preemphasis error estimate to the preemphasis acceleration multiplier 171. The preemphasis acceleration multiplier 171 weights the digital information in the predicted phase preemphasis error estimate according to precomputed preemphasis loop acceleration coefficients stored in the preemphasis acceleration memory 172 to provide an accelerated predicted phase preemphasis error estimate. The accelerated predicted phase gain error estimate is used for a predicted phase preemphasis error, denoted as 179. The predicted phase preemphasis error 179 is passed through a delay to the phase preemphasis correlator 176. The correlator 176 correlates the predicted phase preemphasis error 179 with the measured phase error $\phi_e$ from the switched loop phase detector 70 for providing a phase preemphasis error correlation, denoted as 180, sometimes known as a gradient. During the calibration, the preemphasis calibration loop 84 (FIG. 10B) acts to find the phase preemphasis coefficient $\zeta$ to minimize this correlation 180. The phase preemphasis coefficient $\zeta$ compensates for the frequency response of the LPF 144 that was used to filter the noise from the DAC 142 in order to provide precisely shaped transitions between modulation states.

The gain loop acceleration coefficients and the preemphasis loop acceleration coefficients are Kalman filter coefficients that are pre-computed using a recursive least squares (RLS) algorithm and the input data for the pseudorandom binary sequence (PRBS) that is used for calibration in order to increase the speed at which the gain calibration loop 82 (FIG. 10A) and preemphasis calibration loop 84 (FIG. 10B) converge to the final phase gain and phase preemphasis coefficients $\gamma$ and $\zeta$. Such loop filter coefficients would be calculated on the fly from noisy unknown data but more time would be required. The pre-computation of the acceleration coefficients in the present invention is possible because the PRBS calibration sequence is essentially noiseless and is known in advance. For initial calibration the total time for the phase preemphasis coefficient $\zeta$ and the phase gain coefficient $\gamma$ for a selected divide number N to converge is less than about one-hundred milliseconds. For a calibration list of fifty divide numbers N, the time for the fifty convergences is less than about 5 seconds. For burst calibration, because previous phase gain and preemphasis coefficients γ and ζ are known to start and only need to be fine-tuned, the time for determining the measured phase error $\phi_e$ and the coefficients γ and ζ is less than about four hundred microseconds, and the total time for burst calibration is less than about five-hundred seventy microseconds including one-hundred seventy microseconds for the synthesis loop 86 in the frequency synthesizer 20 to converge to a new carrier frequency.

Figure 6:
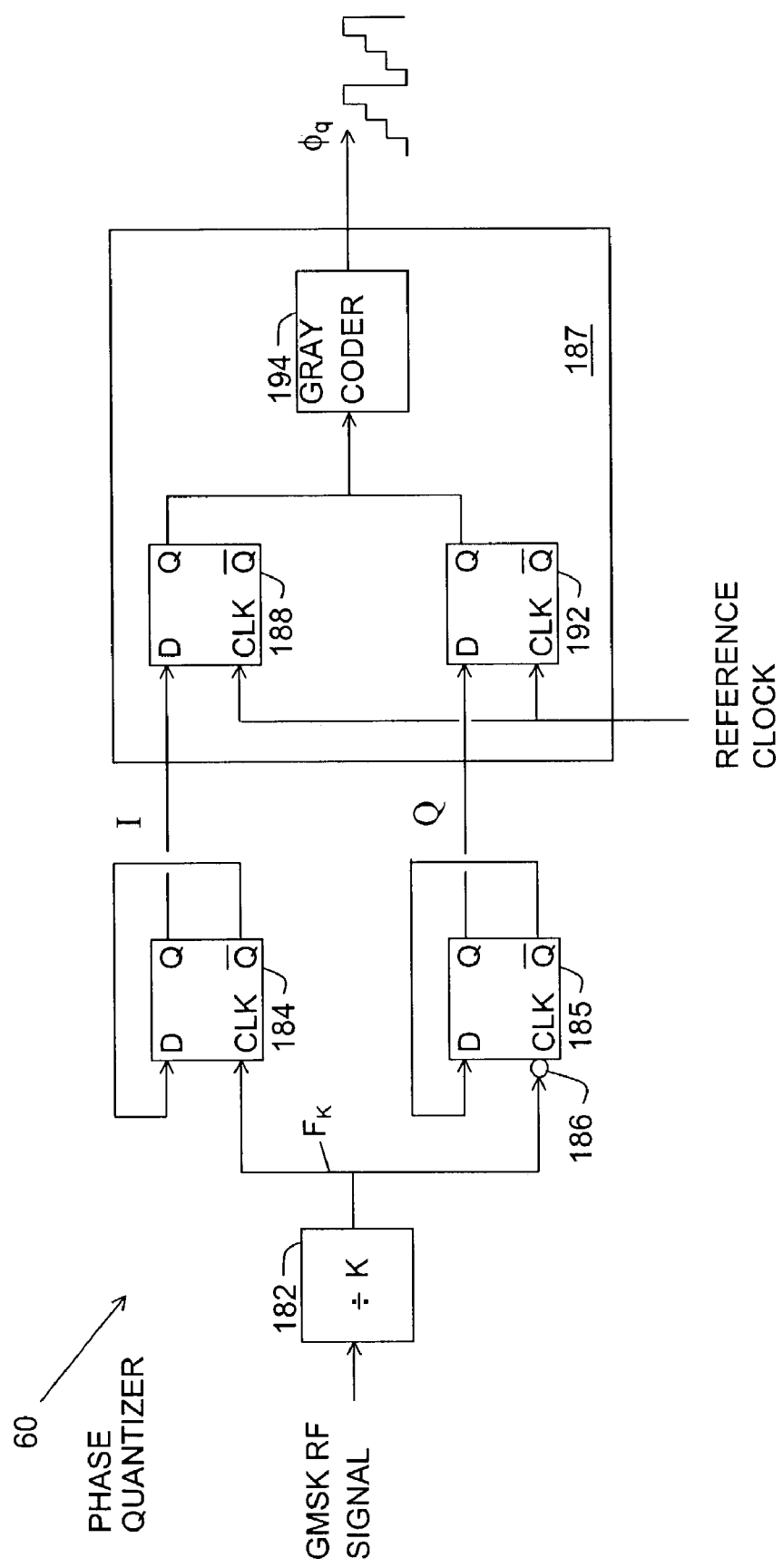
FIG. 6 is a block diagram of a phase quantizer of the transmitter of FIG. 1.

FIG. 6 is a block diagram of the phase quantizer 60. The phase quantizer 60 includes a K frequency divider 182, a first binary divider 184, a second binary divider 185 including an inverter 186, and a gated combiner 187. The gated combiner 187 includes an in-phase (I) gate 188, a quadrature phase (Q) gate 192, and a Gray coder 194. The K frequency divider 182 divides the frequency of the GMSK RF signal by K and passes an $F_K$ signal to the first and second binary dividers 184 and 185. The divide number K is an integer number that is selected so that the frequency of the $F_K$ signal is greater than 2 times the frequency of the reference clock. In order to ensure that all phase points of the RF output signal are sampled the difference between the frequency of the $F_K$ signal and the reference signal is an irrational number.

The first binary divider 184 divides the frequency of the $F_K$ signal by two and issues an I signal to the I gate 188. The inverter 186 inverts the $F_K$ signal and then the second binary divider 185 divides the inverted $F_K$ signal by two and issues a Q signal to the Q gate 192. The I and Q signals have a phase difference of 90° (quadrature). The first and second binary dividers 184 and 185 are implemented with dynamic (D) type flipflops with feedback from a Q output to a D input. It should also be noted that the "Q" notation that is conventionally used for an output of a D-type flipflop is not in any way related to the "Q" notation that is conventionally used to denote a quadrature phase relationship between I and Q signals.

The I gate 188 provides an I gated signal in one bit (two phase states) for a quantized phase $\phi_q$ difference between the reference clock as a gating signal and the I signal. The Q gate 192 provides a Q gated signal in one bit (two phase states) for a quantized phase difference between the reference clock as a gating signal and the Q signal.

The I and Q gates 188 and 192 are also implemented with D-type flipflops. The Gray coder 194 combines the I and Q gated signals for providing a quantized phase signal (FIG. 6B) at a phase carrier frequency as a repeating staircase in two bits (four phase states) for the quantized phases $\phi_q$ of the GMSK RF signal.

FIG. 6A is a block diagram of an alternative embodiment of the phase quantizer 60, where the alternative embodiment is referred to as a phase quantizer 60A. The phase quantizer 60A includes a 2K frequency divider 182A and a gate 187A. The gate 187A is implemented with a D type flipflop. The 2K frequency divider 182A divides the frequency of the GMSK RF signal by two times K and passes an $F_{2K}$ signal to the gate 187A. The gate 187A provides the quantized phase signal (FIG. 6C) at a phase carrier frequency in one bit (two phase states) for the phase difference between the reference clock as a gating signal and the $F_{2K}$ signal. The two phases states represent the $F_{2K}$ signal ahead or behind the reference clock signal. The quantized phase signal carries the quantized phases $\phi_q$ of the GMSK RF signal.

Figure 6B:
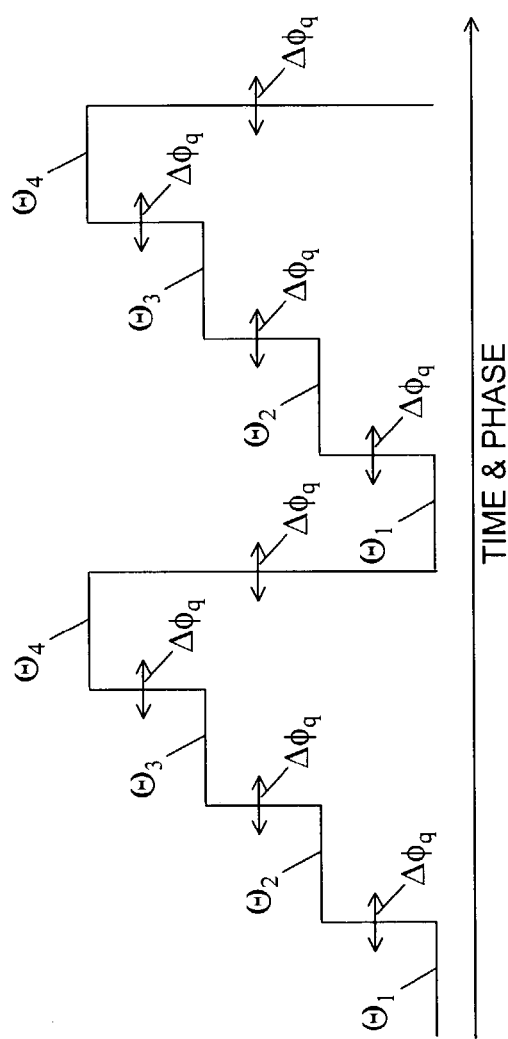
FIG. 6B is a signal diagram of a quantized phase signal for the phase quantizer of FIG. 6.

FIG. 6B shows the quantized phase signal versus continuous time for the quantized phases $\phi_q$ issued by the phase quantizer 60 in four phase states $\Theta_1$, $\Theta_2$, $\Theta_3$ and $\Theta_4$. The continuous time is equivalent to a continuously increasing (rotating) phase of the GMSK RF signal. Variations, denoted $\Delta\phi_q$, in the times of the transitions between the phase states $\Theta_1$, $\Theta_2$, $\Theta_3$ and $\Theta_4$ are representative of phase modulation carried on the GMSK RF signal.

Figure 6C:
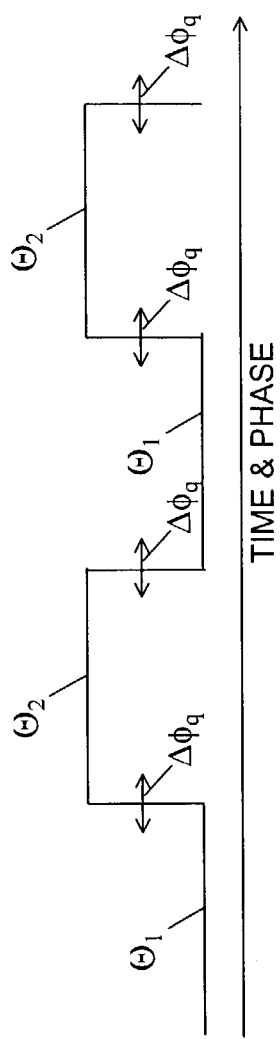
FIG. 6C is a signal diagram of a quantized phase signal for the alternative phase quantizer of FIG. 6A.

FIG. 6C shows the quantized phase signal versus continuous time for the quantized phases $\phi_q$ issued by the phase quantizer 60A in two phase states $\Theta_1$ and $\Theta_2$. The continuous time is equivalent to a continuously increasing (rotating) phase of the GMSK is RF signal. Variations, denoted $\Delta\phi_q$, in the times of the transitions between the phase states $\Theta_1$, and $\Theta_2$ are representative of phase modulation carried on the GMSK RF signal.

Figure 7:
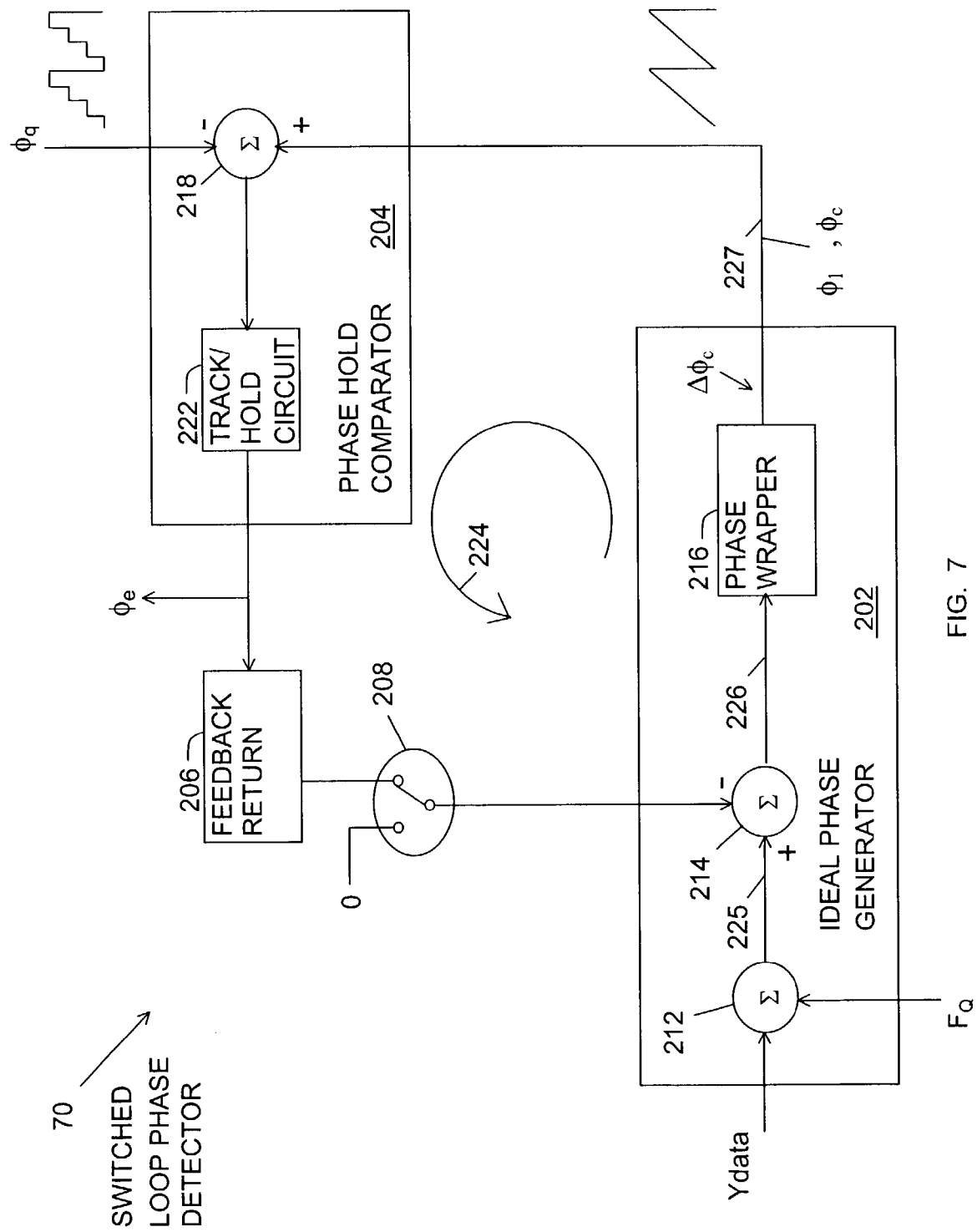
FIG. 7 is a block diagram of a switched loop phase detector of the transmitter of FIG. 1.

FIG. 7 is a block diagram of the switched loop phase detector 70 used for determining the measured phase error $\phi_e$ for calibration. The switched loop phase detector 70 includes an ideal phase generator 202, a phase hold comparator 204, a feedback return 206 and a mode switch 208. The ideal phase generator 202 includes a frequency offset summer 212, a feedback summer 214, and an integrating phase wrapper 216. The phase hold comparator 204 includes a phase comparator 218 and a track/hold circuit 222. The feedback summer 214, the phase wrapper 216 the phase hold comparator 204, the feedback return 206, and the mode switch 208 make up a phase measurement loop 224 constructed as a digital phase lock loop (DPLL).

The frequency offset summer 212 adds a frequency offset to the Ydata input data signal for providing a frequency offset Ydata input data signal 225. The frequency offset is a value that corresponds to the divide number N used by the frequency synthesizer 20 for setting the frequency of the GMSK RF signal minus two times the divide number K used in the phase quantizer 60 (or four times K for the phase quantizer 60A). It should be noted that the level of the frequency offset corresponds to the phase carrier frequency for the quantized phase signal.

To start calibration, the mode switch 14 (FIG. 1) passes the fixed data to the Gaussian shaper 12. The Gaussian shaper 12 provides a corresponding fixed input data signal for the Ydata. The mode switch 208 closes the loop 224 and the feedback summer 214 subtracts the feedback from the mode switch 208 from the frequency offset Ydata input data signal 225 for providing an adjusted frequency offset signal 226 to the phase wrapper 216. The phase wrapper 216 integrates the signal 226 for providing an input phase signal 227 in the shape of a jagged sawtooth having a frequency equal to the phase carrier frequency of the phase quantized signal. The phase of the input phase signal 227 is the phase represented by the Ydata input data signal. At the start of a calibration, this phase, denoted as a first input data phase $\phi_i$ (FIG. 8), has an unknown phase offset. The calibration removes this unknown phase offset.

Figure 7A:
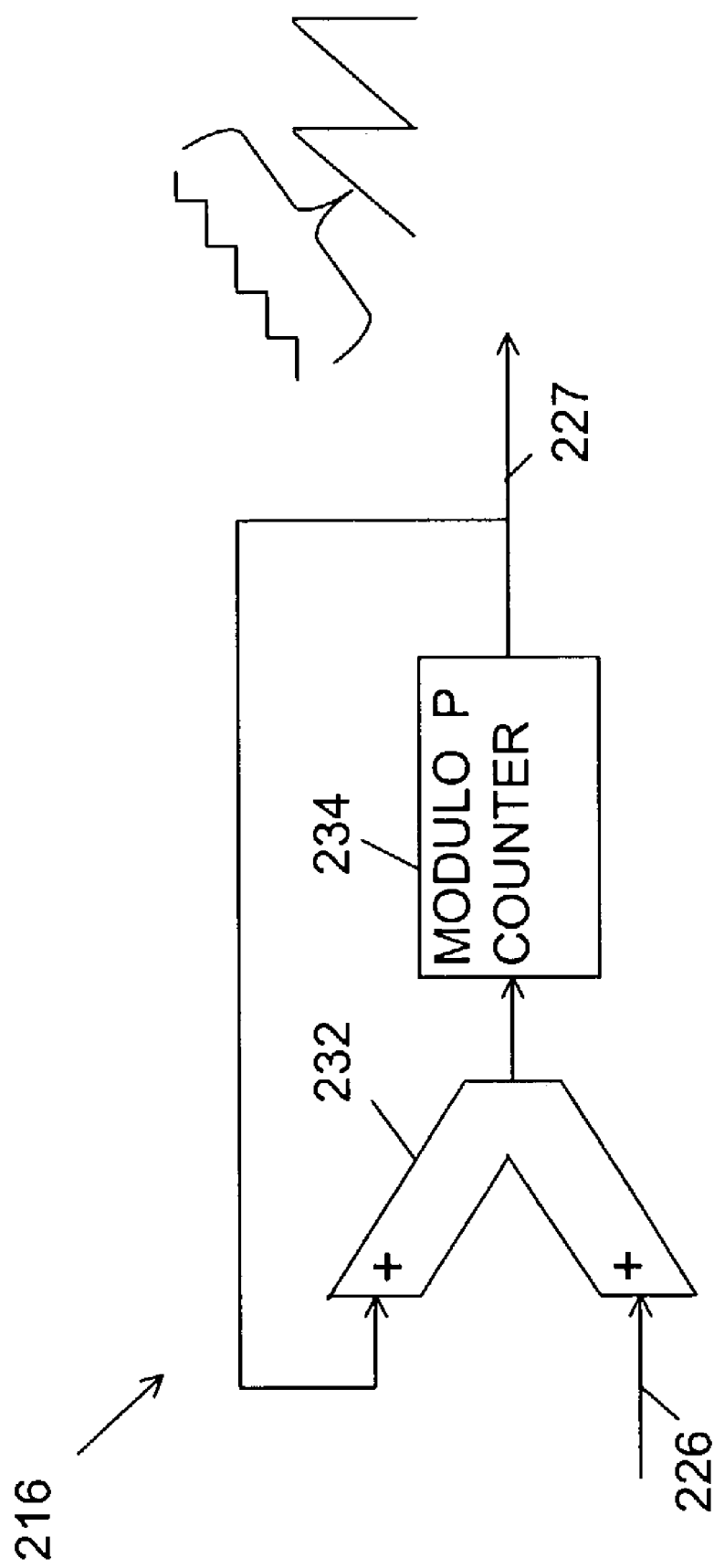
FIG. 7A is a block diagram of a phase wrapper of the switched loop phase detector of FIG. 7.

FIG. 7A is a block diagram of the phase wrapper 216 of a preferred embodiment. When the sawtooth input phase signal 227 approximately reaches a preset upper limit the phase wrapper 216 resets the input phase signal 227 to an approximate preset lower limit. The upper and lower limits are designed to correspond to the upper and lower full scale limits of the quantized phase signal when the quantized phase signal cycles from 360° to 0°. The phase wrapper 216 is a modulo P counter shown here with an input summer 232 and a modulo P limiter 234 where "P" is the full scale count of the counter with the understanding that in a preferred embodiment the summer 232 and the modulo P limiter 234 may operate as a single unit. The input summer 232 adds the signal 226 to the wrapped input phase signal 227 of the modulo P limiter to increment the signal 227 provided by the modulo P limiter 234. The input phase signal 227 increases by increments until it reaches the modulo P where it turns over to start incrementing again. The stairs in the wrapped input phase signal 227 have the time of the sample time of the counter and the amplitudes of the increments. The amplitude increments in the counter represent frequency increments in the desired frequency of the modulated output signal. The effect of the modulo P counter is to integrate the signal 226 representing the frequency of the Ydata input data signal to provide the signal 227 representing the phase of the Ydata input data signal.

Returning to FIG. 7, the phase comparator 218 compares the phase of the input phase signal 227 to the quantized phase $\phi_q$ in the quantized phase signal for providing a phase difference to the track/hold circuit 222. In order to guard against erroneous 360° wrap around measurements caused by small phase noise perturbations, the track/hold circuit 222 holds a level of a previous phase difference when the absolute value of a current phase difference goes to 180° or more. The limited phase difference from the track/hold circuit 222 is passed to the feedback return 206. The feedback return 206 has a loop filter for filtering the phase difference to insert frequency domain poles and/or zeroes in order to stabilize the loop 224 when the loop 224 is closed and passes the filtered phase difference through the mode switch 208 to the feedback summer 214.

The feedback summer 214 subtracts the filtered phase difference from the frequency offset Ydata input data signal 225 and passes the sum as the signal 226 to the phase wrapper 216. The action of the closed loop 224 minimizes the phase difference by driving the phase wrapper 216 to provide a phase calibration $\Delta\phi_c$ (FIG. 8) at its output that phase shifts or offsets the first phase $\phi_I$ of the input phase signal 227 to a calibrated input data phase $\phi_c$ where the unknown first phase offset is eliminated. It may be noted that at this stage of the calibration mode the calibrated input data phase $\phi_c$, and the quantized phases $\phi_q$ are constant because the Ydata is constant. The loop 224 must have a fast response for providing the phase calibration $\Delta\phi_c$, within a short time for calibration within a small portion of the time slot for a burst signal system. The remaining portion of the calibration burst time is required for determining the phase gain and phase preemphasis coefficients $\gamma$ and $\zeta$ after the loop 224 has been opened.

Continuing the calibration mode, after a time period that enables the phase of the input phase signal 227 to converge to the calibrated desired input data phase $\phi_c$, the mode switch 14 (FIG. 1) switches to the PRBS and the Gaussian shaper 12 provides shaped PRBS data as a sequential input data signal for Ydata. It should be noted that the levels of the Ydata represent the desired frequencies of the modulated output signal. The mode switch 208 opens the phase measurement loop 224. The calibrated desired input data phase $\phi_c$ at the offset of the phase calibration $\Delta\phi_c$, is now modulated directly by the integrated sequential input data signal Ydata. The quantized phase $\phi^q$ of the quantized phase signal is also modulated by the Ydata sequential input data signal through the frequency synthesizer 20 and the feedforward converter 30. The limited phase difference from the phase hold comparator 204 is provided as the measured phase error $\phi_e$ to the phase gain compensator 40 and the phase preemphasis compensator 50 for determining the phase gain coefficients $\gamma$ and the phase preemphasis coefficient $\zeta$.

Figure 8:
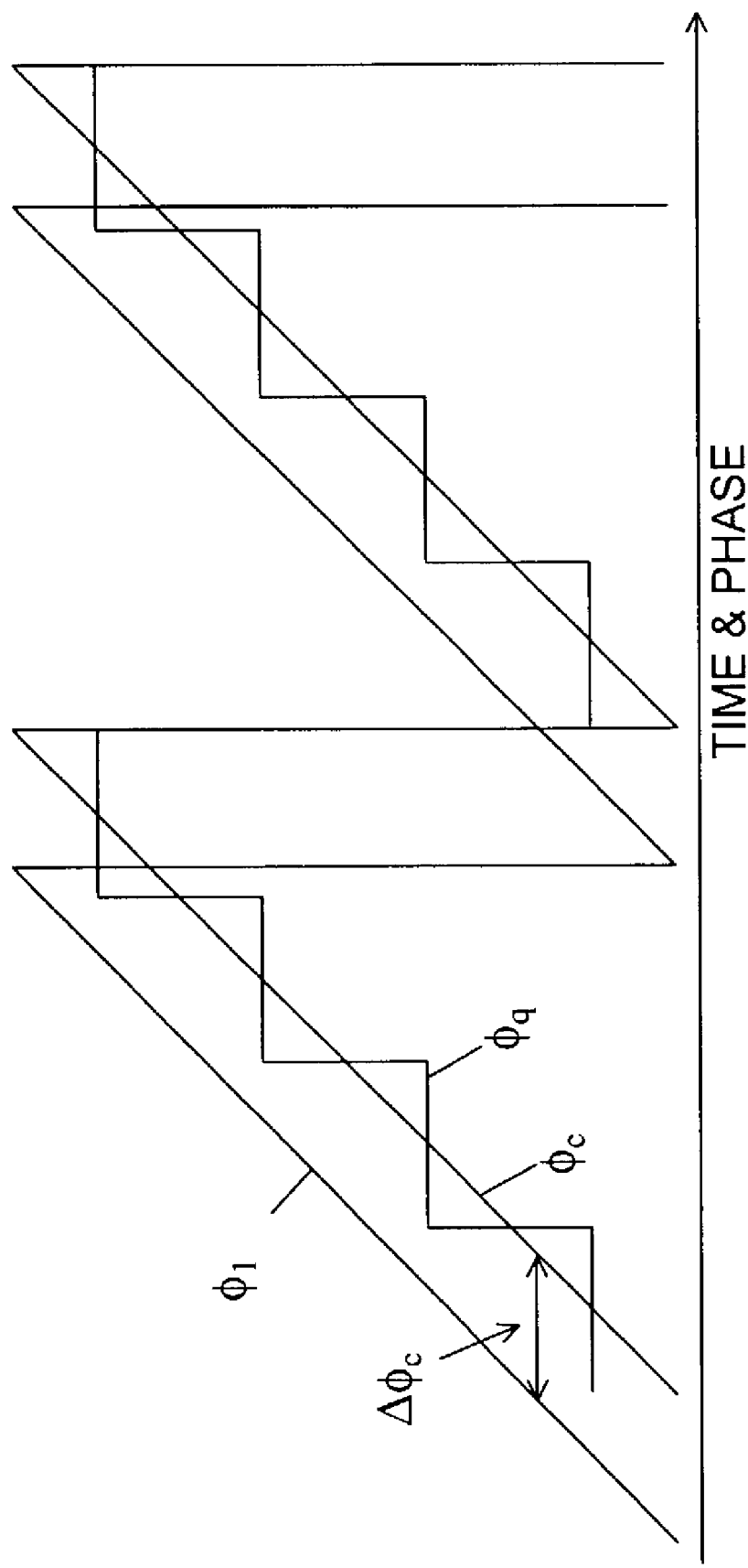
FIG. 8 is a signal diagram showing starting and calibrated input phase signals with respect to a quantized phase signal for the switched loop phase detector of FIG. 7.

FIG. 8 shows the quantized phase signal versus continuous time overlaid against the input phase signal 227 (FIG. 7). The input phase signal 227 begins a new calibration as the fixed input phase signal at the unknown first input data phase, denoted as $\phi_I$, and then converges to the calibrated input phase signal having the calibrated desired input data phase, denoted by $\phi_c$, when the loop 224 provides the phase calibration $\Delta\phi_c$.

At the start of the calibration, the phase measurement loop 224 is closed and the Ydata is a fixed input data signal having a fixed level. The modulated output signal has a fixed phase also. The frequency offset data signal 225 (FIG. 7) is a frequency offset fixed data signal having a fixed level. The signal 226 (FIG. 7) is a feedback adjusted fixed data signal that is the difference of the frequency offset fixed data signal and the feedback of the phase measurement loop 224 (FIG. 7). The input phase signal 227 is a fixed input phase signal that starts at the unknown phase $\phi_I$ that converges to a calibrated input phase signal having the calibrated phase $\phi_c$ with the phase calibration $\Delta\phi_c$.

Still in the calibration, the phase measurement loop 224 is opened and the Ydata is a sequential input data signal a pseudorandom sequence. The modulated output signal has a sequential modulated phase derived from the Ydata sequential input data signal. The frequency offset data signal 225 and the signal 226 are a frequency offset sequential data signals. The input phase signal 227 is a calibrated sequential input phase signal that retains the phase calibration $\Delta\phi_c$. The calibrated sequential input phase signal is compared to the quantized phase signal for providing the measured phase error $\phi_e$ that is used by the gain and preemphasis calibration loops for determining the phase gain coefficients $\gamma$ and the phase preemphasis coefficient $\zeta$.

FIG. 9 is a flow chart of the calibration of the modulated output signal transmitted by the GMSK transmitter 10. The calibration is used to determine the phase gain coefficients $\gamma$ and the phase preemphasis coefficient $\zeta$. The coefficients $\gamma$ and $\zeta$ are then used in on-line operation for reducing errors in frequency conversion gain and frequency response of frequency conversion gain from the Ydata input data signal and the modulation states and transitions between the modulation states in the modulated output signal. Major causes of these errors are the variation in voltage to frequency conversion gain in the VCO 104 over its output frequency range and the frequency response of the low pass filter 144.

The calibration mode is started at a step 302 when the mode switch 14 selects input data of 0 and the Gaussian shaper 12 provides a fixed Ydata input data signal. In a step 304 for burst calibration, the loop gain of the synthesis loop 86 in the frequency synthesizer 20 is adjusted by the interpolated phase gain coefficient $\gamma$ for the current divide number N from the phase gain coefficients $\gamma$ for the calibration list of divide numbers N that were determined previously in the initial calibration. In the step 306 the loop 86 settles for the current divide number N and the VCO 104 provides an RF output signal (unmodulated at this step). In a step 308 the switched loop phase detector 70 closes the loop 224, or it is already closed, and provides an unknown first phase $\phi_I$ for the fixed input phase signal 227 by integrating the frequency information represented by the frequency offset fixed Ydata signal 225. In a step 312 the phase quantizer 60 quantizes the phases of the RF output signal for providing the quantized phase $\phi_q$. In a step 314 the quantized phase $\phi_q$ is compared to the first phase $\phi_I$ of the fixed input phase signal 227 for providing a phase difference. In a step 316 the closed loop 224 provides feedback to the frequency offset fixed Ydata signal 225 to shift the first phase $\phi_I$ by the phase calibration $\Delta\phi_c$ to calibrated desired phase $\phi_c$ for the input phase signal 227 that minimizes the phase difference between the calibrated desired phase $\phi_c$ and the quantized phase $\phi_q$ (FIG. 8).

Next, in a step 318 the mode switch 14 selects the pseudorandom binary sequence (PRBS), the Gaussian shaper 12 shapes the PRBS for providing a PRBS sequential Ydata input data signal, and the frequency synthesizer 20 begins modulating the RF output signal. In a step 322 the switched loop phase detector 70 opens the loop 224. In a step 324 the desired sequential phases in the calibrated sequential input phase signal 227 are compared to the quantized phases $\phi_q$. The difference between the desired sequential phases and the actual sequential quantized phases $\phi^q$ are provided as the measured phase error $\phi_e$.

The phase gain compensator 40 make the predicted phase gain error estimates and the phase preemphasis compensator 50 make the predicted phase preemphasis error estimates in a step 326. In a step 328 the phase gain and preemphasis error estimates are accelerated for determining the predicted (accelerated) phase gain and preemphasis errors 167 and 179. In a step 332 the predicted phase gain and preemphasis errors 167 and 179 are correlated with the measured phase error $\phi_e$ for forming the correlations 168 and 180. In a step 334 the gain and preemphasis calibration loops 82 and 84 converge to the minimum averages of the correlations 168 and 180, respectively, (and the average phase measurement errors $\phi_e$) for determining the phase and preemphasis coefficients $\gamma$ and $\zeta$. In the step 334, it should be noted that Ydata sequential input data signal is scaled and preemphasized by the phase gain and preemphasis coefficients $\gamma$ and $\zeta$ as they converge in the feedforward converter 30 for providing the feedforward signal FFS and the modulated output signal is generated in the frequency synthesizer 20 within the calibration gain and preemphasis loops 82 and 84. In a burst calibration, the calibration list of phase gain coefficients $\gamma$ are determined in a round robin fashion with one divide number N for each burst calibration session. For an initial calibration, a step 348 is inserted to repeat the steps 302–334 until a list of phase gain coefficients $\gamma$ are determined and stored for the corresponding calibration list of divide numbers N. For the initial calibration, it may not be necessary to repeat the determination of the phase preemphasis coefficient for each of the calibration list of divide numbers N.

The GMSK transmitter 10 now enters the on-line operation mode. In a step 352 the mode switch 14 selects the on-line data and the Gaussian shaper 12 shapes the on-line binary data to provide a burst on-line Ydata input data signal. In a step 354 the frequency synthesis loop 86 uses the phase gain coefficient $\gamma$ for the current divide number N to adjust the loop gain of the frequency synthesis loop 86. The phase gain coefficient $\gamma$ is interpolated for the current divide number N from the phase gain coefficients $\gamma$ that are stored for the calibration list of divide numbers N. In a step 356 the feedforward converter 30 scales and preemphasizes the Ydata on-line input data signal for providing the feedforward signal FFS. In a step 358 the frequency synthesizer 20 uses feedforward signal FFS to the VCO 104, the current divide number N, the interpolated phase gain coefficient $\gamma$, and the Ydata on-line data signal in the synthesis loop 86 for providing the 20 modulated RF GMSK output signal having precise frequency modulation.

FIG. 10A is a block diagram showing the phase gain compensator 40 and the gain calibration loop 82 used for determining the phase gain coefficients $\gamma$ during calibration. The combination of the phase gain compensator 40 and the gain calibration loop 82 is a preferred embodiment of a phase gain determination system 402. The gain calibration loop 82 includes the feedforward converter 30, the frequency synthesizer 20, the phase quantizer 60, the switched loop phase detector 70, and the phase gain correlator 164 and the gain accumulator 166 in the phase gain compensator 40. The phase gain correlator 164 correlates the predicted phase gain error 167 with the measured phase gain error $\phi_e$ for providing the phase gain error correlation 168. The action of feedback in the gain calibration loop 82 minimizes the average phase gain error correlation 168 causing the output of the gain accumulator 166 to converge to the phase gain coefficient $\gamma$. It should be noted that the average measured phase error $\phi_e$ is also minimized by the feedback of the gain calibration loop 82.

FIG. 10B is a block diagrams showing the phase preemphasis compensator 50 and the preemphasis calibration loop 84 used for determining the phase preemphasis coefficient $\zeta$ during calibration. The combination of the phase preemphasis compensator 50 and the preemphasis calibration loop 84 is a preferred embodiment of a phase preemphasis determination system 404. The preemphasis calibration loop 84 includes the feedforward converter 30, the frequency synthesizer 20, the phase quantizer 60, the switched loop phase detector 70, and the phase preemphasis correlator 176 and the preemphasis accumulator 178 in the phase preemphasis compensator 50. The phase preemphasis correlator 176 correlates the predicted phase preemphasis error 179 with the measured phase gain error $\phi_e$ for providing the phase preemphasis error correlation 180. The action of feedback in the preemphasis calibration loop 84 minimizes the average phase preemphasis error correlation 180 causing the output of the preemphasis accumulator 178 to converge to the phase preemphasis coefficient $\zeta$. Both the gain calibration loop 82 and the preemphasis calibration loop 84 operate simultaneously. It should be noted that the average measured phase error $\phi_e$ is also minimized by the feedback of the preemphasis calibration loop 84.

FIG. 11A is a chart of a typical frequency conversion gain G(fo) of the VCO 104 and the compensating phase gain coefficients $\gamma$(fo) as a function of the output carrier frequency fo. The VCO frequency conversion gain G(fo) is the ratio of a frequency deviation $\Delta$fo at the carrier frequency fc to a change in the level $\Delta$A of the analog input drive to the VCO 104. The phase gain coefficient $\gamma$(fo) is a dimensionless number. It should be noted that the frequency conversion gain of a VCO is related to the phase conversion gain by a constant. For an output carrier frequency fo of frequency $f_N$ for a divide number N the phase gain coefficient $\gamma(f_N)$ is determined so that the product of the frequency conversion gain $G(f_N)$ and phase gain coefficient $\gamma(f_N)$ is a constant, shown here normalized to 1.0.

FIG. 11B is a chart showing frequency conversion gains before calibration $g_b(f_m,f_N)$ and after calibration $g_a(f_m,f_N)$ for the GMSK transmitter 10 for the output frequency $f_N$ as a function of modulating frequency $f_m$. Note that the modulating frequency $f_m$ is equal to the signal frequency (as opposed to the frequency deviation that is represented) of the Ydata input data signal. The frequency conversion gains $g_b(f_m,f_N)$ and $g_a(f_m,f_N)$ are the ratio of a frequency deviation $\Delta$fo in the output frequency fo of the GMSK transmitter 10 (the same as the output frequency fo of the VCO 104) to a change in the level $\Delta$a of the Ydata input data signal (not the same as the $\Delta$A above for direct drive to the VCO 104). It should be understood the frequency conversion gains $g_b(f_m,f_N)$ and $g_a(f_m,f_N)$ are shown on a logarithmic vertical scale so at any one modulating frequency $f_m$, the higher line on the chart dominates the overall frequency conversion gain of the GMSK transmitter 10 for that modulating frequency $f_m$.

A frequency response 450 shows the desired flat frequency response normalized to 1.0. Frequency response 452A–B is provided by the frequency synthesis loop 86 in the frequency synthesizer 20. Due to the high accuracy of the fractional divider 106 and the high open loop gain of the frequency synthesis loop 86, the frequency response in section 452A is essentially identical to the desired frequency response 450 without a need for calibration for modulating frequencies $f_m$ lower than the synthesis loop bandwidth $BW_1$. However, above the synthesis loop bandwidth $BW_1$, the frequency response in section 452B quickly diverges downward from the desired frequency response 450.

Frequency responses 454A–C and 456A–C show the frequency responses driven by the feedforward signal FFS before $g_b(f_m,f_N)$ and after $g_a(f^m,f_N)$ compensation by the phase gain coefficient $\gamma(f_N)$ for the selected carrier frequency $f_N$. In the frequency response of section 454A at modulating frequencies $f_m$ below the synthesis loop bandwidth $BW_1$, the frequency synthesis loop 86 counteracts and reduces the effect of the feedforward signal FFS. In the frequency response in sections 454B and 454C at modulating frequencies $f_m$ above the synthesis loop bandwidth $BW_1$, the feedforward signal FFS is the dominant driver of the overall frequency response. In the section 454C the frequency response diverges downward from the frequency response 450 above the low pass filter bandwidth $BW_2$ of the filter 144.

The frequency response 456A–C shows the result of the scaling the frequency responses 454A–C by the phase gain coefficient $\gamma(f_N)$. In section 456A at modulating frequencies $f_m$ below the synthesis loop bandwidth $BW_1$, the frequency synthesis loop 86 counteracts and reduces the effect of the feedforward signal FFS. However, the frequency response in sections 456B and 456C for modulating frequencies $f_m$ above the synthesis loop bandwidth $BW_1$, the feedforward signal FFS is the dominant driver of the overall frequency response. The compensation by the phase gain coefficient $\gamma(f_N)$ results in the frequency response of the section 456B being nearly identical with the desired frequency response 450. In the section 456C for modulating frequencies $f_m$ above the low pass filter bandwidth $BW_2$, the frequency response falls off from the desired frequency response 450 due to the low pass filter 144. The phase preemphasis coefficient $\zeta$ is used to boost the response 456C to a frequency response 458 to nearly match the desired response 450. A frequency response 462 shows in a general way the effect that the phase preemphasis coefficient $\zeta$ would have in the absence of the low pass filtering of the filter 144.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An apparatus for measuring phase error of a modulated output signal having modulation derived from an input data signal, comprising:
   a phase quantizer for phase quantizing said modulated output signal for providing a quantized phase signal having quantized phases; and
   a switched loop phase detector having a phase measurement loop using feedback for phase shifting a fixed input phase signal corresponding to a fixed said input data signal by a phase calibration to a calibrated input phase signal that minimizes a phase difference between said quantized phase signal and said calibrated input phase signal, the phase measurement loop including mode switch and a phase comparator, the mode switch opening said phase measurement loop when said phase calibration has been determined and the phase comparator comparing said quantized phase signal with a calibrated sequential input phase signal corresponding to a sequential said input data signal phase shifted by said phase calibration when said phase measurement loop is open for providing a measured phase error.

2. The apparatus of claim 1, wherein:
   said quantized phase signal has a phase carrier frequency for carrying said quantized phases; and
   the switched loop phase detector includes a frequency offset summer for summing said fixed input data signal with an offset value corresponding to said phase carrier frequency for providing a frequency offset fixed data signal and then summing said sequential input data signal with said offset value for providing a frequency offset sequential data signal, said frequency offset fixed data signal used for providing said fixed input phase signal and then said calibrated input phase signal, said frequency offset sequential data signal used for providing said calibrated sequential input phase signal.

3. The apparatus of claim 2, wherein:
   said phase measurement loop includes a feedback summer for adjusting said frequency offset fixed data signal with said feedback from said phase difference when said phase measurement loop is closed, said adjusted frequency offset fixed data signal used for providing said phase calibration.

4. The apparatus of claim 3, wherein:
   said phase measurement loop includes a phase wrapper for integrating said adjusted frequency offset fixed data signal for providing said calibrated input phase signal, and then integrating said frequency offset sequential data signal for providing said calibrated sequential input phase signal having said phase calibration.

5. The apparatus of claim 4, wherein:
   said phase wrapper provides said calibrated input phase signal and said calibrated sequential input phase signal as sawtooth shaped signals at said phase carrier frequency.

6. The apparatus of claim 3, wherein:
   said phase wrapper converges to said phase calibration when said measurement loop is closed, and then holds said phase calibration for providing said calibrated sequential input phase signal when said measurement loop is open.

7. The apparatus of claim 1, wherein:
   the switched loop phase detector includes a track/hold circuit for holding a level of a previous said measured phase error when the absolute value of said measured phase error approaches about 180°.

8. The apparatus of claim 1, wherein:
   the switched loop phase detector includes the mode switch for closing and then opening said phase measurement loop; an ideal phase generator for converting said fixed input data signal into said fixed input phase signal converging to said calibrated input phase signal when said phase measurement loop is closed and then converting said sequential input data signal into said calibrated sequential input phase signal when said phase measurement loop is open; a feedback return for providing said feedback from said phase difference for phase shifting said fixed input phase signal by said phase calibration to said calibrated input phase signal in order to minimize said phase difference when said phase measurement loop is closed; and the phase comparator for comparing said fixed and then said calibrated input phase signals to said quantized phase signal for providing said phase difference when said phase measurement loop is closed and then comparing said calibrated sequential input phase signal and said quantized phase signal for said sequential input data signal when said phase measurement loop is open for providing said measured phase error.

9. The apparatus of claim 1, wherein:
the phase quantizer includes a gate for gating a lower frequency representation of said modulated output signal with a gating signal having an irrational frequency relationship with said modulated output signal for providing said quantized phase signal.

10. The apparatus of claim 1, wherein:
the phase quantizer includes a first binary divider for frequency dividing a lower frequency representation of said modulated output signal for providing an in-phase (I) signal; an inverter for inverting said representation of said modulated output signal for providing an inverted signal; a second binary divider for frequency dividing said inverted signal for providing a quadrature phase (Q) signal; and a gated combiner for combining said I and Q signals for providing said quantized phase signal.

11. The apparatus of claim 10, wherein:
the gated combiner includes a first gate for gating said I signal with a gating signal for providing an I gated signal; a second gate for gating said Q signal with said gating signal for providing a Q gated signal; and a Gray coder for coding said I and Q gated signals for providing said quantized phase signal.

12. A method for measuring phase error of a modulated output signal having modulation derived from an input data signal, comprising:
phase quantizing said modulated output signal for providing a quantized phase signal having quantized phases;
phase shifting a fixed input phase signal corresponding to a fixed said input data signal by a phase calibration to a calibrated input phase signal with feedback in a closed phase measurement loop that minimizes a phase difference between said quantized phase signal and said calibrated input phase signal;
opening said phase measurement loop; and then
comparing said quantized phase signal with a calibrated sequential input phase signal corresponding to a sequential said input data signal phase shifted by said calibration phase when said phase measurement loop is open for providing a measured phase error.

13. The method of claim 12, wherein:
said quantized phase signal has a phase carrier frequency for carrying said quantized phases; and further comprising:
summing said fixed input data signal with an offset value corresponding to said phase carrier frequency for providing a frequency offset fixed data signal; using said frequency offset fixed data signal for providing said fixed input phase signal and then said calibrated input phase signal; summing said sequential input data signal with said offset value for providing a frequency offset sequential data signal; and using said frequency offset sequential data signal for providing said calibrated sequential input phase signal.

14. The method of claim 13, wherein:
the step of phase shifting includes adjusting said frequency offset fixed data signal with said feedback from said phase difference; and using said adjusted frequency offset fixed data signal for providing said phase calibration.

15. The method of claim 14, wherein:
the step of phase shifting includes integrating said adjusted frequency offset fixed data signal for providing said calibrated input phase signal; and then integrating said frequency offset sequential data signal for providing said calibrated sequential input phase signal having said phase calibration.

16. The method of claim 15, wherein:
the step of phase shifting includes issuing said calibrated input phase signal and said calibrated sequential input phase signal as sawtooth shaped signals at said phase carrier frequency.

17. The method of claim 14, wherein:
the step of phase shifting includes converging to said phase calibration when said measurement loop is closed; and then holding said phase calibration for providing said calibrated sequential input phase signal when said measurement loop is open.

18. The method of claim 12, wherein:
the step of comparing includes holding a level of a previous measured phase error when the absolute value of said measured phase error nears about 180°.

19. The method of claim 12, wherein:
the step of phase shifting includes converting said fixed input data signal into said fixed input phase signal; comparing said fixed input phase signal with said quantized phase signal for providing said phase difference for said fixed input data signal; and phase shifting said fixed input phase signal with said phase calibration to said calibrated input phase signal by minimizing said phase difference in said closed measurement loop; and the step of comparing includes using said phase calibration for converting said sequential input data signal into said calibrated sequential input phase signal; and comparing said calibrated sequential input phase signal and said quantized phase signal for said sequential input data signal when said measurement loop is open for providing said measured phase error.

20. The method of claim 12, wherein:
the step of phase quantizing includes gating a lower frequency representation of said modulated output signal with a gating signal having an irrational frequency relationship with said modulated output signal for providing said quantized phase signal.

21. The method of claim 12, wherein:
the step of phase quantizing includes frequency dividing a lower frequency representation of said modulated output signal for providing an in-phase (I) signal; inverting said representation of said modulated output signal for providing an inverted signal; frequency dividing said inverted signal for providing a quadrature phase (Q) signal; and combining said I and Q signals for providing said quantized phase signal.

22. The method of claim 21, wherein:
the step of combining includes gating said I signal with a gating signal for providing an I gated signal; gating said Q signal with said gating signal for providing a Q gated signal; and coding said I and Q gated signals for providing said quantized phase signal.

* * * * *